US009935631B2

(12) United States Patent
Gong et al.

(10) Patent No.: US 9,935,631 B2
(45) Date of Patent: Apr. 3, 2018

(54) METHODS AND APPARATUSES USING CONTROL INDICATORS FOR DATA PROCESSING SYSTEMS

(75) Inventors: Andrew Gong, San Mateo, CA (US); Brian Q. Huppi, San Carlos, CA (US); Christoph H. Krah, San Jose, CA (US); Richard D. Cappels, Mesa, AZ (US); Duncan R. Kerr, San Francisco, CA (US); Michael Culbert, Monte Sereno, CA (US)

(73) Assignee: Apple Inc., Cupertino, CA (US)

( * ) Notice: Subject to any disclaimer, the term of this patent is extended or adjusted under 35 U.S.C. 154(b) by 735 days.

(21) Appl. No.: 13/095,806

(22) Filed: Apr. 27, 2011

(65) Prior Publication Data

US 2011/0199226 A1    Aug. 18, 2011

Related U.S. Application Data

(62) Division of application No. 11/378,146, filed on Mar. 16, 2006, now Pat. No. 7,936,348, which is a division
(Continued)

(51) Int. Cl.
H03K 17/96 (2006.01)
G06F 1/32 (2006.01)
H03K 17/18 (2006.01)

(52) U.S. Cl.
CPC ......... *H03K 17/962* (2013.01); *G06F 1/3206* (2013.01); *H03K 17/18* (2013.01); *H03K 2217/96079* (2013.01)

(58) Field of Classification Search
None
See application file for complete search history.

(56) References Cited

U.S. PATENT DOCUMENTS 2,329,011 A * 9/1943 Steiner ............... G03B 15/0452
200/51.08
4,339,632 A * 7/1982 Early ..................... H04M 1/22
200/314
(Continued)

FOREIGN PATENT DOCUMENTS

EP    0 623 869 A1    11/1994
JP    2000-163031 A    6/2000
(Continued)

OTHER PUBLICATIONS

Final Office Action dated Aug. 31, 2005, for U.S. Appl. No. 09/905,632, filed Jul. 13, 2001, six pages.
(Continued)

*Primary Examiner* — David D Davis
(74) *Attorney, Agent, or Firm* — Morrison & Foerster LLP

(57) ABSTRACT

A control indication assembly. A first control mounted on a surface of a computer is coupled to a first sensor, to a first sensing circuit to send an electrical signal to the first control when a user-touch occurs to the first sensor, and to a first indicator to indicate an occurrence of said user-touch. A second control mounted on a surface of a display which is coupled to the computer is coupled to a second sensor, to a second sensing circuit to send an electrical signal to said second control when said user-touch occurs to the display, and to a second indicator to indicate an occurrence of the user-touch. The first and second control are configured such that the first and second indicator are synchronized to exhibit identical behaviors when the user-touch occurs to either the first control or the second control.

19 Claims, 19 Drawing Sheets

Related U.S. Application Data of application No. 09/905,632, filed on Jul. 13, 2001, now Pat. No. 7,034,814.

(56) References Cited

U.S. PATENT DOCUMENTS

| | | | |
|---|---|---|---|
| 4,528,642 A | 7/1985 | Waller | |
| 4,825,257 A | 4/1989 | Yoshino | |
| 4,855,740 A * | 8/1989 | Muramatsu | G06F 3/0238 341/23 |
| 4,958,143 A * | 9/1990 | Knauff | B60Q 1/2611 315/178 |
| 5,040,479 A * | 8/1991 | Thrash | 116/279 |
| 5,311,175 A | 5/1994 | Waldman | |
| 5,396,443 A | 3/1995 | Mese et al. | |
| 5,481,256 A * | 1/1996 | Darbee | G08C 19/28 341/176 |
| 5,483,261 A | 1/1996 | Yasutake | |
| 5,488,204 A | 1/1996 | Mead et al. | |
| 5,530,879 A | 6/1996 | Crump et al. | |
| 5,537,463 A * | 7/1996 | Escobosa | G08C 19/28 348/734 |
| 5,572,283 A * | 11/1996 | Wakabayashi et al. | 396/279 |
| 5,614,906 A * | 3/1997 | Hayes | G08C 19/28 340/12.28 |
| 5,670,992 A * | 9/1997 | Yasuhara | G06F 1/1613 345/173 |
| 5,764,547 A | 6/1998 | Bilich et al. | |
| 5,767,844 A * | 6/1998 | Stoye | G06F 1/3209 345/168 |
| 5,790,107 A | 8/1998 | Kasser et al. | |
| 5,825,352 A | 10/1998 | Bisset et al. | |
| 5,835,079 A | 11/1998 | Shieh | |
| 5,855,483 A * | 1/1999 | Collins | A63F 3/00643 434/307 R |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,657,616 B2 * | 12/2003 | Sims | 345/173 |
| 6,690,387 B2 | 2/2004 | Zimmerman et al. | |
| 6,781,638 B1 * | 8/2004 | Hayes | G08C 17/00 348/734 |
| 6,797,902 B2 * | 9/2004 | Farage et al. | 200/314 |
| 7,015,894 B2 | 3/2006 | Morohoshi | |
| 7,034,814 B2 | 4/2006 | Gong et al. | |
| 7,184,064 B2 | 2/2007 | Zimmerman et al. | |
| 7,283,059 B2 * | 10/2007 | Harris | G08C 19/28 340/12.25 |
| 7,663,607 B2 | 2/2010 | Hotelling et al. | |
| 7,936,348 B2 | 5/2011 | Gong et al. | |
| 8,378,972 B2 * | 2/2013 | Pance et al. | 345/170 |
| 8,479,122 B2 | 7/2013 | Hotelling et al. | |
| 2001/0012240 A1 * | 8/2001 | Terzian | G04G 9/0082 368/82 |
| 2006/0026521 A1 | 2/2006 | Hotelling et al. | |
| 2006/0197753 A1 | 9/2006 | Hotelling | |
| 2010/0079106 A1 * | 4/2010 | Graham | H02J 7/0044 320/115 |
| 2010/0097348 A1 * | 4/2010 | Park et al. | 345/175 |
| 2012/0181935 A1 * | 7/2012 | Velazquez | H05B 37/0272 315/132 |

FOREIGN PATENT DOCUMENTS

| | | |
|---|---|---|
| JP | 2002-342033 A | 11/2002 |
| WO | WO-03/007139 A2 | 1/2003 |
| WO | WO-03/007139 A3 | 1/2003 |

OTHER PUBLICATIONS

Final Office Action dated Feb. 19, 2010, for U.S. Appl. No. 11/378,146, filed Mar. 16, 2006, nine pages.

Final Office Action dated Oct. 13, 2010, for U.S. Appl. No. 11/378,146, filed Mar. 16, 2006, five pages.

International Search Report dated Jun. 21, 2004, for PCT Application No. PCT/US02/20692, filed Jun. 28, 2002, five pages.

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Non-Final Office Action dated Mar. 18, 2005, for U.S. Appl. No. 09/905,632, filed Jul. 13, 2001, six pages.

Non-Final Office Action dated Jul. 22, 2009, for U.S. Appl. No. 11/378,146, filed Mar. 16, 2006, seven pages.

Non-Final Office Action dated Apr. 29, 2010, for U.S. Appl. No. 11/378,146, filed Mar. 16, 2006, seven pages.

Notice of Allowance dated Nov. 17, 2005, for U.S. Appl. No. 09/905,632, filed Jul. 13, 2001, six pages.

Notice of Allowance dated Dec. 27, 2010, for U.S. Appl. No. 11/378,146, filed Mar. 16, 2006, four pages.

Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

PCT Invitation to Pay Additional Fees for PCT International Appln No. US02/20692, dated Apr. 2, 2004 (5 pages).

Communication Pursuant to Article 96(2) EPC, Application No. 02 75 2122.8-2224, dated Jul. 4, 2007 (3 pages).

European Search Report Under Rule 112 EPC, Application No. 02 75 2122.8-2224, dated Jul. 27, 2007 (6 pages).

European Search Report dated Jul. 22, 2015, for EP Application No. 15164869.8, four pages.

\* cited by examiner

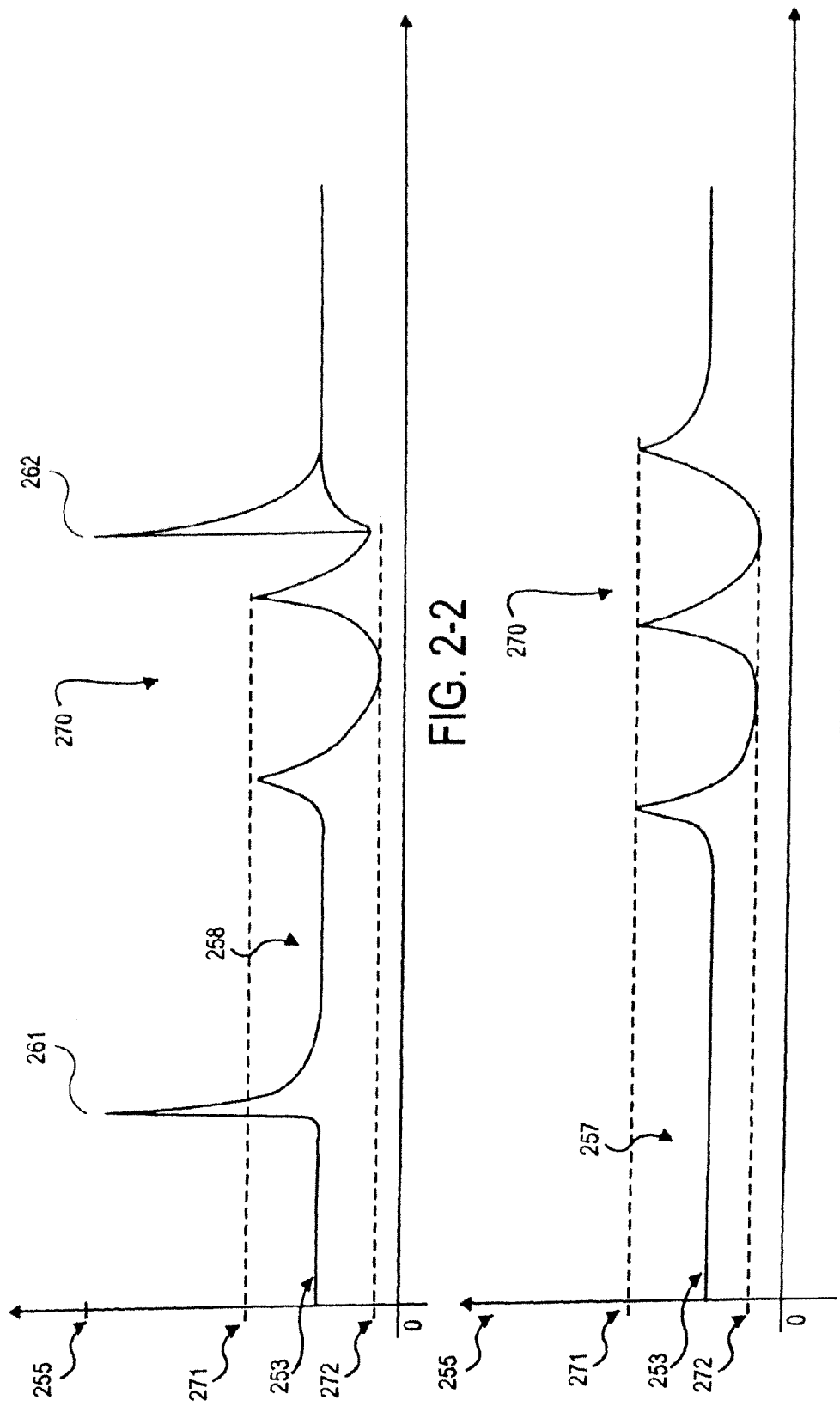

ns and apparatuses using
METHODS AND APPARATUSES USING CONTROL INDICATORS FOR DATA PROCESSING SYSTEMS This application is a divisional application of U.S. patent application Ser. No. 11/378,146, filed on Mar. 16, 2006, now U.S. Pat. No. 7,936,348 which is a divisional of U.S. patent application Ser. No. 09/905,632, filed on Jul. 13, 2001, entitled "Methods and Apparatuses Using Control Indicators for Data Processing Systems," and now issued as U.S. Pat. No. 7,034,814.

BACKGROUND OF THE INVENTION

The present invention relates to a computer system with control indicators.

A personal computer system may be thought of as a general-purpose, single-user microcomputer that is designed to be operated by a person. A small and low cost personal computer (PC) may include a monitor display connected to a computer, each of which may receive power from an ordinary outlet. In operation, the monitor accepts video signals from a graphics card within the computer over a cable assembly and displays this information on a screen.

A personal computer system typically employs an electromechanical control, such as a power button, to turn on and off the computer system. The monitor display connected to the computer also employs a similar electromechanical control to turn on and off the display. These controls typically work separately and independently from each other. Each of these controls may also include an indicator (e.g., a light emitting diode (LED)) which emits light when the corresponding control is activated, and these indicators typically work separately and independently of each other. For example, when the power button on the display is activated, the display's LED emits light regardless of the state of the power button of the computer. Although in some case, the color of the light from the display's LED depends on whether the computer is supplying display data to the display (e.g., the computer is off or is in a low power (e.g. "sleep") mode).

A personal computer system is often set up such that the power input into the display is controlled by the computer's power. For instance, when a user turns on or turns off the computer by pressing the power button on the computer tower, the display may also be likewise turned on or off without the user having to press the power button on the display. Nonetheless, currently the display may not be configured to control the power input to the computer system.

SUMMARY OF THE INVENTION

The present invention discloses methods and apparatuses for using control indicators for data processing system. A control indication assembly of one of the embodiments of the present invention includes a first control mounted on a surface of a computer. The first control is coupled to a first sensor and to a first sensing circuit to send an electrical signal to the first control when a user-touch occurs to the first sensor. The first control is also coupled to a first indicator to indicate an occurrence of said user-touch. The control indication assembly also includes a second control mounted on a surface of a display and the display is coupled to the computer. The second control is coupled to a second sensor and to a second sensing circuit to send an electrical signal to said second control when said user-touch occurs to the display. The second control is also coupled to a second indicator to indicate an occurrence of the user-touch. The first control and the second control are configured such that the first indicator and the second indicator are synchronized to exhibit identical behaviors when the user-touch occurs to at least to either the first control or the second control.

BRIEF DESCRIPTION OF DRAWINGS

FIG. 2-1 graphically illustrates an example of a "triggering behavior" of a control indicator.

FIGS. 2-2 and 2-3 graphically illustrate an example of a "breathing behavior" of a control indicator.

FIG. 2-4 illustrates a computer system with a menu preference control.

FIG. 2-5 illustrates an exemplary electromechanical control assembly.

FIG. 3 illustrates an exemplary proximity-touch sensor control assembly.

FIG. 4-A illustrates an example of an LED as an indicator.

FIG. 4-B illustrates an example of a light pattern that the LED emits when the LED is disposed inside a light pipe.

FIG. 5 illustrates an exemplary computer system set up with synchronizing control indicators using a proximity-touch sensor control assembly.

FIG. 5-1 illustrates an example of a "proximity" and "triggering" behavior of a proximity-touch sensor control indication assembly.

FIGS. 5-2 and 5-3 illustrate examples of "breathing" behaviors of a proximity-touch sensor control indication assembly.

FIG. 6-1 illustrates an exemplary flowchart for operating the control indicator from a power-disconnected state to run mode and to sleep mode.

FIG. 6-2 illustrates an exemplary flowchart for operating the control indicator from a sleep mode to a run mode and to a shutdown mode.

FIG. 6-3 illustrates an exemplary flowchart for operating the control indicator from a run mode to a shutdown mode.

DETAILED DESCRIPTION OF THE INVENTION

The following description and drawings are illustrative of the invention and are not to be construed as limiting the invention. Numerous specific details are described to provide a thorough understanding of the invention. For example, very specific geometries and dimensions are provided for purposes of illustrating the invention. In certain instances, well known or conventional details are not described in order to not unnecessarily obscure the present invention in detail.

Figure 1:
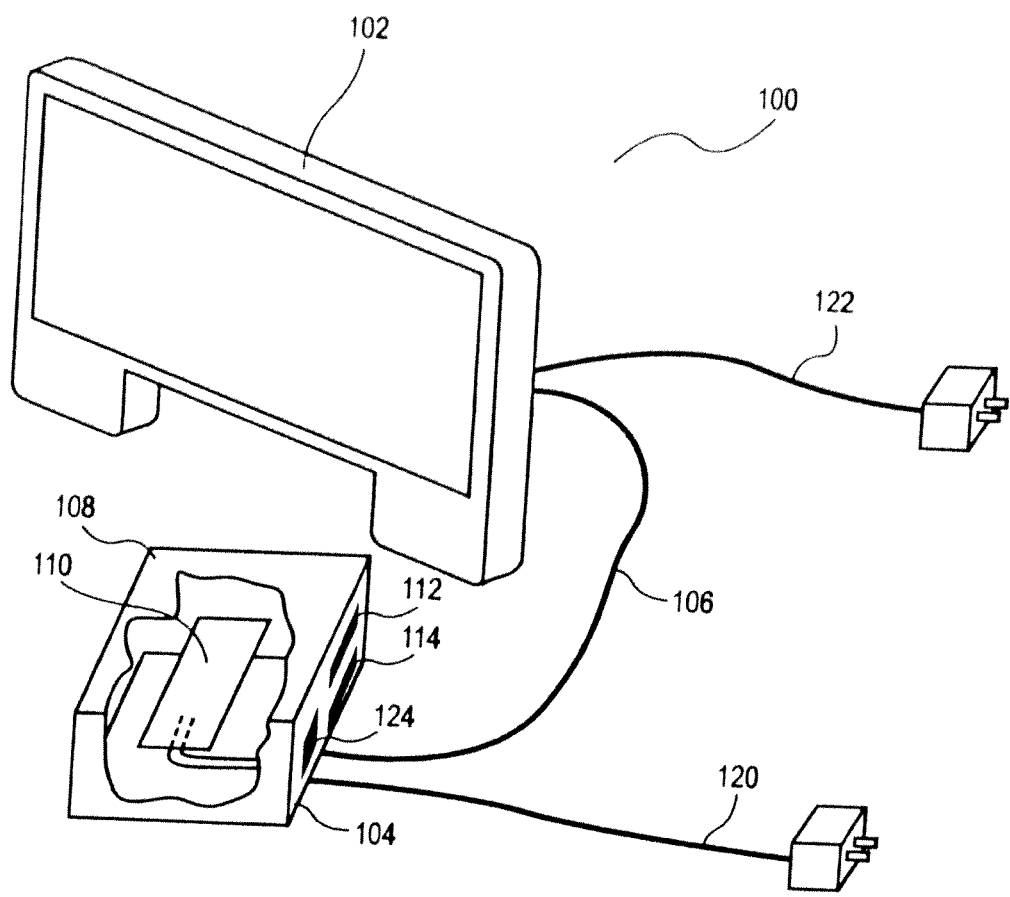
FIG. 1 illustrates a conventional computer system.

FIG. 1 illustrates a personal computer system 100 in a desktop configuration. A computer system 100 may include a monitor or a display 102, a desktop computer 104, and a cable assembly 106. The display 102 may be a cathode-ray tube and associated electronics connected to a video output of desktop computer 104, or it may be a flat panel display such as a liquid crystal display. The desktop computer 104 may be any machine that can be programmed to process data.

The desktop computer 104 may include a chassis 108 having a graphics card 110, which is disposed therein. The chassis 108 may also have a Small Computer System Interface (SCSI) slot 112, a Peripheral Component Interconnect (PCI) slot 114 located as shown in FIG. 1, and/or it may have a Universal Serial Bus (USB), and/or "Firewire" interfaces (which are based on IEEE 1394). Each of the SCSI slot 112 and PCI slot 114 and/or USB and Firewire interfaces may provide an input/output port for connection of external devices.

Each of the hardware devices of a conventional computer system independently controls its own power input. The desktop computer 104 draws its power supply via a computer power cable 120 and the display 102 draws its power supply via a display power cable 122. The display power cable 122 may also be connected directly to a power socket 124 on the desktop 104 such that the desktop 104 controls the power supply for the display 102.

The desktop computer 104 and the display 102 also have light indicators (not shown) to indicate their operating status, such as green light for "on" and no light for "off." From a user's experience, the computer system 100 comprises of a series of connected devices each with its own different controls, interactions and behaviors. For instance, the light indicator on the desktop computer 104 may light up independently and at a different time from the light indicator on the display 102. One purpose of an embodiment of this invention is to provide computer system users with an experience that the computer system 100 is a unified system rather than as a series of connected but separate devices. The following discussion describes exemplary embodiments of controls with indicators such as power controls for the display 102 and the desktop 104 which interact with each other and synchronize in their behaviors to create that unified system. However, it will be appreciated that the indicators and power controls may be used on other devices such as printers, external storage devices (such as CD drives), etc.

Figure 2A:
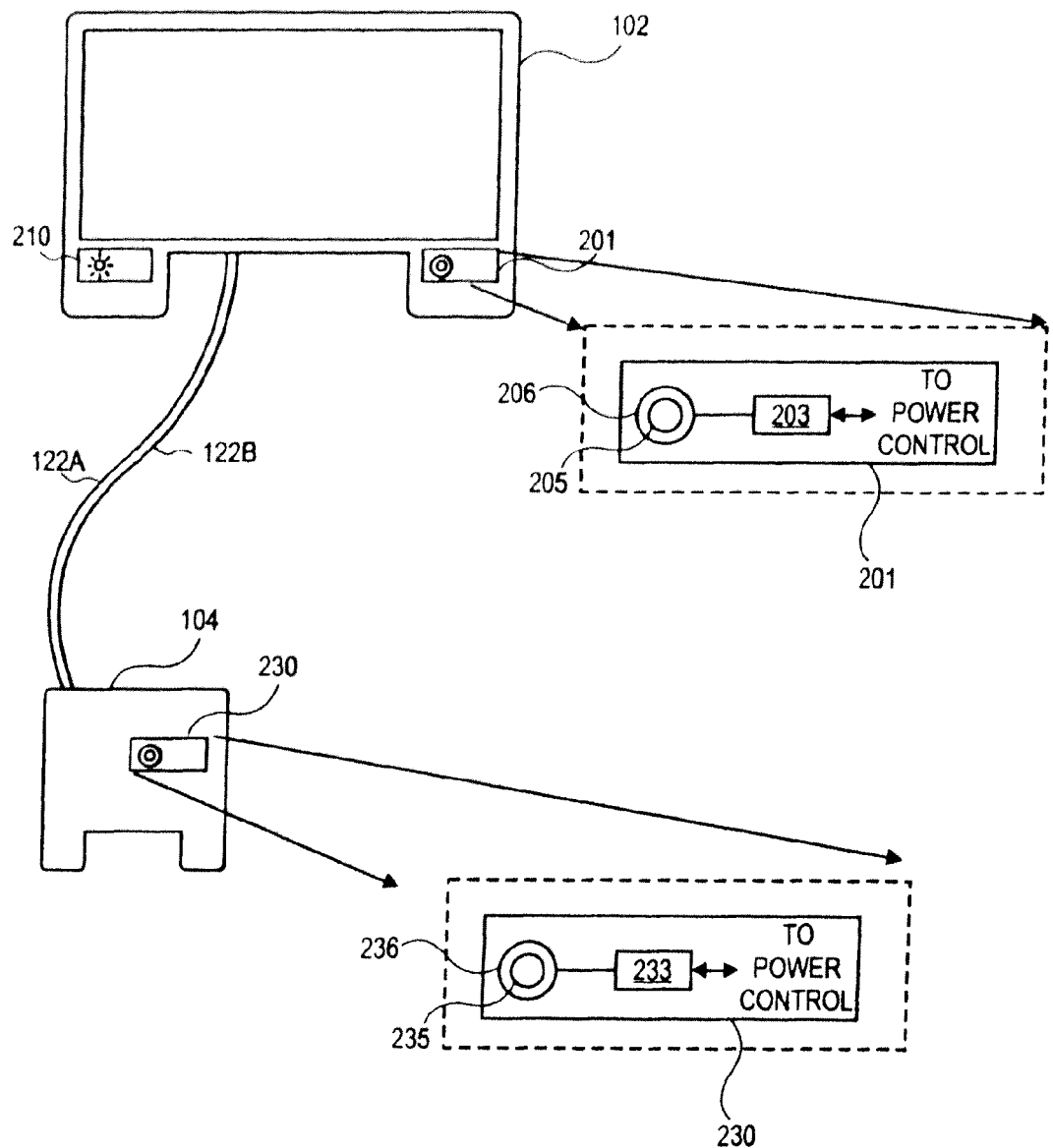
FIG. 2A illustrates an example of a computer system set up with synchronized control indicators.

FIG. 2A shows an exemplary design of a control system for a computer system 200, which comprises a display 102, connected to a desktop 104 via at least one cable. A power cable 122A for power input for the display 102 is connected to the desktop 104 in one embodiment. An exemplary display for the display 102 is a cathode-ray tube or a flat panel display.

The desktop 104 may be a Central Processing Unit (CPU) tower which has a control assembly 230 to control the power input for this tower or it may have other shapes (e.g., cube) or formfactors. The desktop 104 also includes a control assembly 230. The control assembly 230 may include a typical electromechanical power button switch used for many existing computer systems or it may be a touch sensitive switch. The control assembly 230, however, includes a feedback indicator to (e.g., a light emitting diode (LED)) show the user that the computer system has been triggered.

In one exemplary embodiment, the control assembly 230 is mounted within the computer system's CPU. Preferably, the control assembly 230 is mounted behind or near the power control button (e.g., a button 236). The control assembly 230 includes a button assembly 237 which includes a touch sensitive button 236 (or alternatively, a mechanical button) and an indicator 235. The indicator 235 may be a light source or a sound indicator. Here the indicator 235 is an LED, which could be in any color or a combination of multiple colors. In this example, the LED is white which is one of the unique features of the present invention. The LED may be mounted underneath an outer surface of the button 236 and on the centerline of the button 236 as shown in FIG. 2-5. The button 236 and the indicator 235 are coupled to a circuit 233 which controls the indicator's presentation (e.g., the intensity of the LED) and which sends power control signals to the CPU (e.g., "power on" or "sleep" or "power off" signals to a power management unit in the CPI). These power control signals result from a user's interaction (e.g., touching) with the button 236. If the computer is off when the user presses or touches the button 236, then the circuit 233 sends a signal which causes the computer to turn on (effectively a "power on" signal). If the computer is on when the user presses or touches the button 236, then the circuit 233 sends a signal which causes the computer to enter a reduced power mode (e.g., "sleep"). If the user presses or touches the button 236 for an extended period of time (e.g., more than three seconds), then the circuit 233 sends a signal which causes the computer to shut down (turn off).

The control assembly 230 may be triggered or activated by a user pressing the button 236, which in turn activates the computer system if it was off when the user pressed the button 236. When the control assembly 230 activates the computer system the user experiences a "triggering" behavior. The triggering behavior occurs when the control assembly 230 is activated, which causes an LED indicator 235 to first exhibit a short and bright flash of intensity then fade to a lower intensity level.

Figures 1, 2:
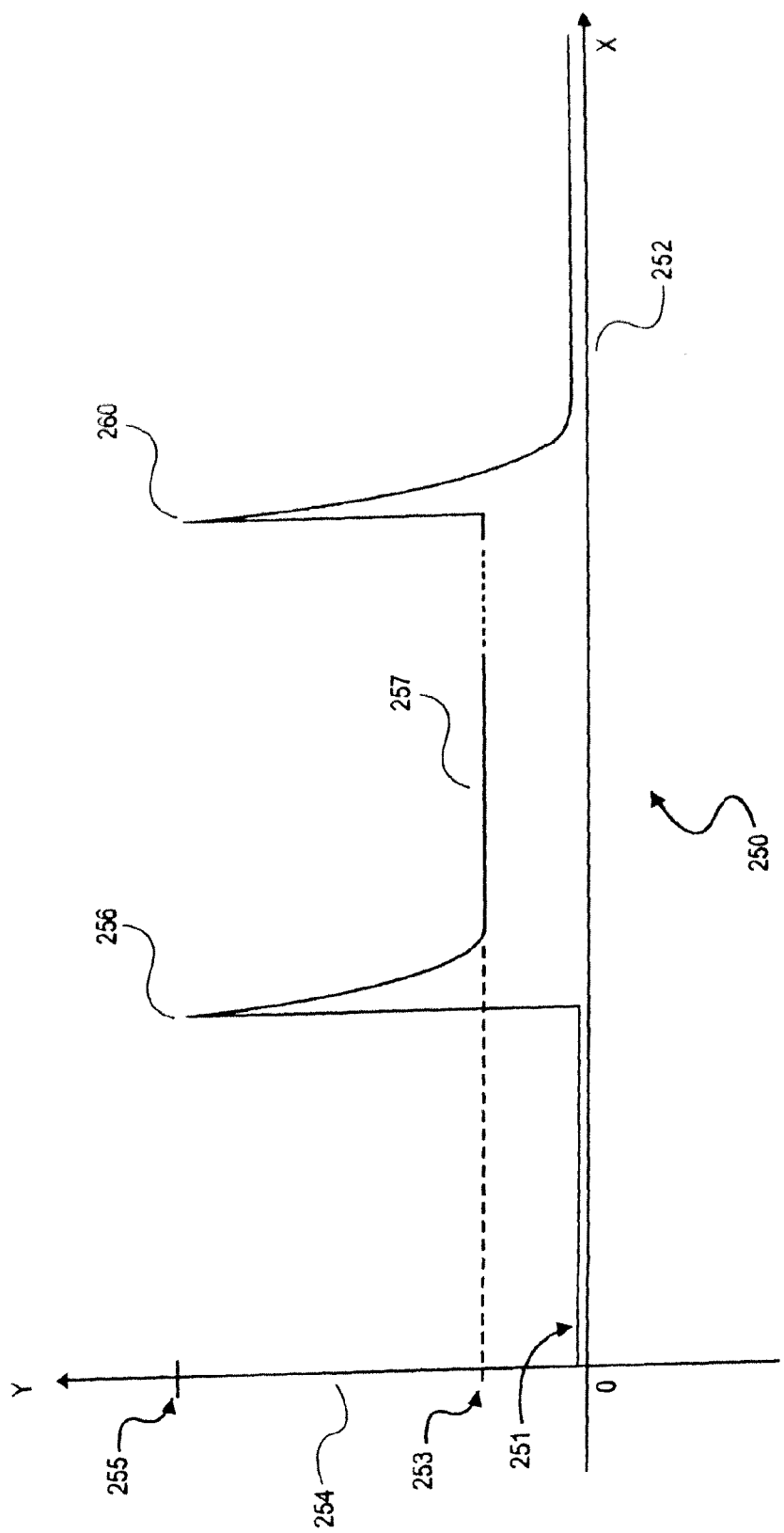

FIG. 2-1 graphically demonstrates an example of triggering behavior 250. In FIG. 2-1, the x-axis 252 indicates a time line, the y-axis 254 indicates the intensity for the LED indicator 235. As the computer system is in the shutdown mode, the intensity is at the "zero" level as shown by a line 251. As a user-touch occurs to the button 236, (see a touch event 256), the LED intensity shoots up to a maximum brightness 255 (in which case, the touch event 256 appears as a plateau rather than a spike). The LED may maintain its 255 intensity for the duration of the touch event 256. The user then releases the mechanical button 236, the LED's intensity then fades from a level 255 to a low glow level 253 and the computer system is now in run mode.

The control assembly 230 may be configured so that once the control assembly 230 is triggered by the touch event 256, it cannot be triggered again until the user has released the button 236 and represses it (with a touch event 260). By activating the control assembly 230 again, the user may put the computer into a shutdown or a sleep mode. In either instance, the same triggering behavior as discussed above is again experienced by the user with the exception that after the touch 260, the LED intensity fades from a level 255 to a "zero" intensity level 251 for shutdown mode and, in one embodiment, appears to repetitively increase and then decreases in intensity.

The computer system may be set up such that the activation of the control assembly 230 on the desktop 104 also activates the monitor 102. Alternatively, the computer system may be set up in a manner that will give the user a unique experience that the desktop 104 and the monitor 102 are indeed one unified system because every time the user triggers either one of them, the user will trigger the whole system such that the indicators on both the desktop 104 and the monitor 102 appear to behave the same way.

The monitor 102 may include a control assembly 201 much like control assembly 230 discussed above. The control assembly 201 is mounted within the monitor 102, preferably, at a right hand corner of the monitor. The control assembly 201 includes a button assembly, which includes a touch sensitive button 206 and an indicator 205. The indicator 205 may also be an LED of any color or combination of colors, preferably, white. The LED indicator 205 may be mounted underneath an outer surface of the button 206 and on the centerline of the button 206 as discussed above.

The button 206 and the indicator 205 are coupled to a circuit 203 which controls the indicator's presentation (e.g., the intensity of the LED on the display 102) and which sends power control signals to the CPU (e.g., "power on" or "power off" or "sleep" signals to a power management unit in the CPU). An embodiment of the circuit 233 of the control assembly 230 and an embodiment of the circuit 203 of the control assembly 201 are further described below.

The power cable 122A of the monitor 102 may be coupled to the desktop 104 such that the monitor 102 draws its power source through the desktop 104. The control assembly 201 interfaces with the control assembly 230 via a cable 122B, which functions as a communication line between the display 102 and the desktop 104. The set up above enables the user to activate the computer system by triggering either the control assembly 201 or the control assembly 230.

When the user activates the computer system from the control assembly 201, the user experiences the same triggering behavior 250 on the display 102 described above for the control assembly 230 (see FIG. 2-1). However, only the mechanical button being touched exhibits the triggering behavior 250 so that the user knows how and from where the computer system is activated. For example, if the user touches assembly 201 to turn on the computer system, only the assembly 201 exhibits the flash of high intensity level 255. Once either the control assembly 201 or the control assembly 230 is triggered so as to turn on the computer system, both the LED indicator 205 and the LED indicator 235 exhibits the same low glow level 253 to show that the whole system is in run mode. Similarly, when either the control assembly 201 or the control assembly 230 is triggered so as to shut down or to put the computer system into sleep mode, both LED indicators exhibit the same "zero" intensity level 251 to show the system in shutdown mode or the intensity levels of both LEDs fluctuate to show sleep mode.

Another unique feature of the present invention is that the indicator 205 and the indicator 235 are configured to exhibit synchronizing "breathing" behaviors to show that the computer system is in the sleep mode. The unified system experience is enhanced by a design that synchronize the behaviors of the indicator 205 and the indicator 235. Such a breathing behavior may be a rythymatic and repetitive patterns of sounds, movements, light or the like.

Figures 2, 3, 4:
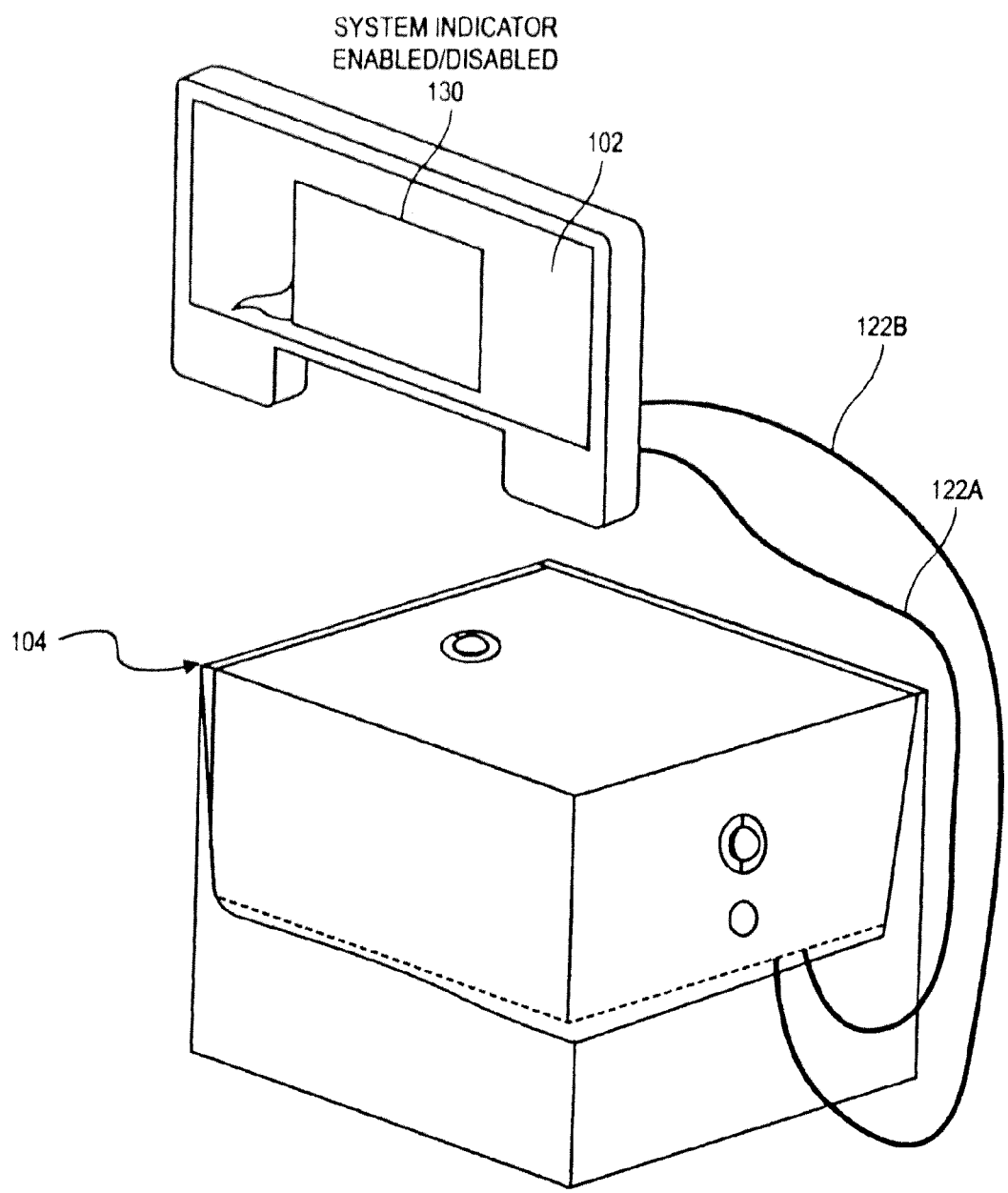

In one embodiment, the breathing behavior may be indicated by a rythymatic and repetitive pattern of light intensity. FIGS. 2-2 and 2-3 graphically demonstrate this breathing behavior, breathing behavior 270. The computer system may go from a run mode to a sleep mode via the activation of either the control assembly 201 or the control assembly 231 or via a software selection from a graphical user interface or automatically after a predetermined period of no activity. When in sleep mode, both the control assembly 201 and 231 synchronize in their breathing behaviors. The intensities of both of the LED indicators 205 and 235 fluctuate from a maximum sleep intensity 271 to a minimum sleep intensity 272 in a rythymatic and repetitive manner. A unique feature of this embodiment is that both LED indicators synchronize in their breathing behaviors to show the user that the whole computer system is a sleep mode.

In another example, the computer system may be configured with an energy-saving option. Using this option, the computer system may be set to automatically go from a run mode into a sleep mode after a predetermined amount of time that the system is in idle state. This amount of time may be set by the user to be, for instance, five minutes. FIG. 2-3 graphically demonstrates that the intensities of the LED indicator 205 and the LED indicator 235 go directly from run mode at intensity level 253 into sleep mode with intensity fluctuating from level 271 to level 272. Note that in this example, no touch event occurs, thus, the intensity of the LED indicators never approach the level 255 before it drops to the level 271.

The computer system may also be put to sleep mode manually. For example, the user may trigger the sleep mode by selecting a preference at the monitor display 102 or by some other user interactions. The intensities exhibited by the LED indicators may be the same as those shown in FIG. 2-3.

The triggering behavior and the breathing behavior may be enabled or disabled as per a user's preference. For example, as shown in FIG. 2-4, from a preference menu 130 the computer system may be set to enable or disable these behaviors.

Electromechanical controls with LED inside have been used in the field on products and systems such as computers and stereo systems. However, the use of LED as an indicator that exhibit triggering type light behavior when a user triggers or activates a computer system is one unique and novel application of LEDs into these controls of the present invention. Thus, not only the present invention gives the user an experience that the hardware devices of a computer system are part of a unified system, it shows the user that the computer system has been activated.

The control assembly as discussed above may be made into a touch-sensor control assembly. A touch-sensor control assembly may rely on a purely electrical mechanism and no mechanical pressing of any button is required. This feature will enable easy activation or triggering of a computer system.

FIG. 3 demonstrates an exemplary embodiment of a touch-sensor control assembly 300. The basic design here is that as a user lightly touches the area in which the touch-sensor control assembly 300 is mounted, the computer system can be triggered. The user may generate a user-touch to this area with his fingers, body parts, other objects, or by any other convenient manner.

The touch-sensor control assembly 300 may be a proximity sensor which can sense a user-touch about to happen within a predetermined distance before the user actually touches (physically contacts) the sensor. The proximity-touch sensor of this example serves two purposes, namely to indicate a touch condition or occurrence and to indicate the proximity of a user (utilizing the indicator 316 which may be an LED). Proximity/Touch sensing is accomplished by measuring the capacitance of a disk shaped antenna that resides within the sensor 306 behind or on the exterior panel of the appliance, such as a desktop 104 or a display 102. A grounded object, such as a user-touch brought close to the antenna will increase the antenna capacitance. The capacitance is translated into the frequency domain by loading a free running oscillator with the antenna capacitance. A change in the antenna capacitance will result in change in frequency. A frequency then is measured by a micro controller, processed and passed to the LED, and when reaching a certain threshold, passed as a launch event to a power management unit that resides inside the CPU.

As will be apparent, the proximity-touch sensor control assembly has the capability of automatic re-calibration, sensing and signaling a user-touch and sensing and signaling the continuation of the user-touch on the power controls. An example of a system for implementing a proximity-touch sensor control assembly is described in co-pending U.S. patent application Ser. No. 09/886,237, filed on Jun. 20, 2001 and entitled "Proximity/Touch Detector and Calibration Circuit" (inventors: Christopher H. Krah, and Richard D. Cappels), which application is hereby incorporated herein by reference.

The proximity-touch sensor control assembly 300 is coupled to a control 302 having an electrical switch to trigger or activate a computer system. The assembly 300 further includes a sensor 306, which may be a capacitive sensing field, a sensing circuit 308, an indicator 316 and a light pipe 314. The indicator 316 may be a sound or light indicator and in this example, an LED of any color or a combination of multiple colors, preferably, white, to add to the uniqueness of the present invention. The LED indicator 316 is located in the light pipe 314 directly underneath an outer surface 312 of the appliance. The LED indicator 316 may also be mounted such that it is at the center of the sensor 306 for optimal sensitivity.

The LED indicator 316 is used to give a user feedback on his interaction with the proximity-touch sensor control assembly 300 and the computer system. In one example, the LED indicator 316 flashes and fades as a user-touch occurs to the assembly 300 in the same manner as the indicators 205 and 235 (see FIGS. 2-1, 2-2, and 2-3). Furthermore, the intensity of the LED indicator 316 increases as the user approaches the assembly 300 thus indicating to the user that he is close to the triggering or activating area.

The light pipe 314 is used to guide the light illumination of the LED 316. As indicated in FIG. 4-A where there is no light pipe 316, LED's light illumination 400 has the 402 illumination pattern with the brightest intensity at point 404. Light pipe 314 disposing about the LED 316 is used when a flatter curve of light illumination is desirable for a more uniform light illumination appearance. This practice is well known in the field and is used when guiding of light intensity is desirable. When the light pipe 314 is used, the user will see a well lit and uniform circular area as opposed to one bright point.

Figures 2, 3, 4, 5:
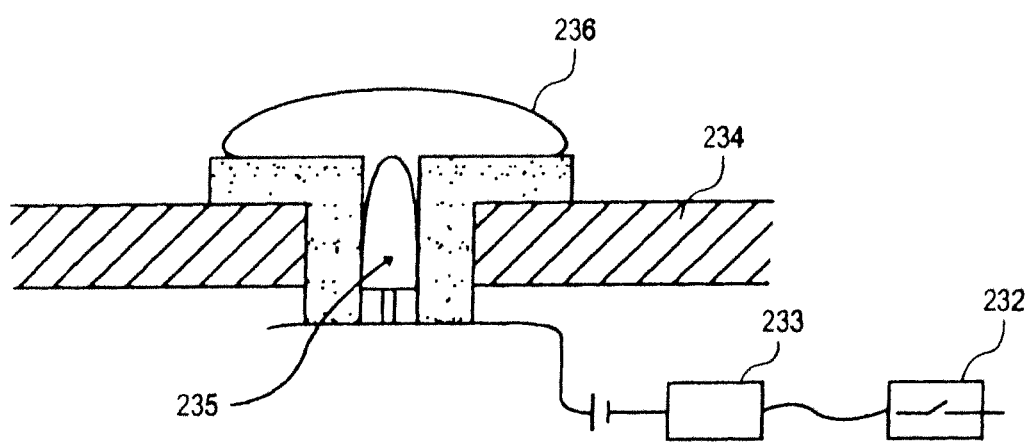
Figure 3:
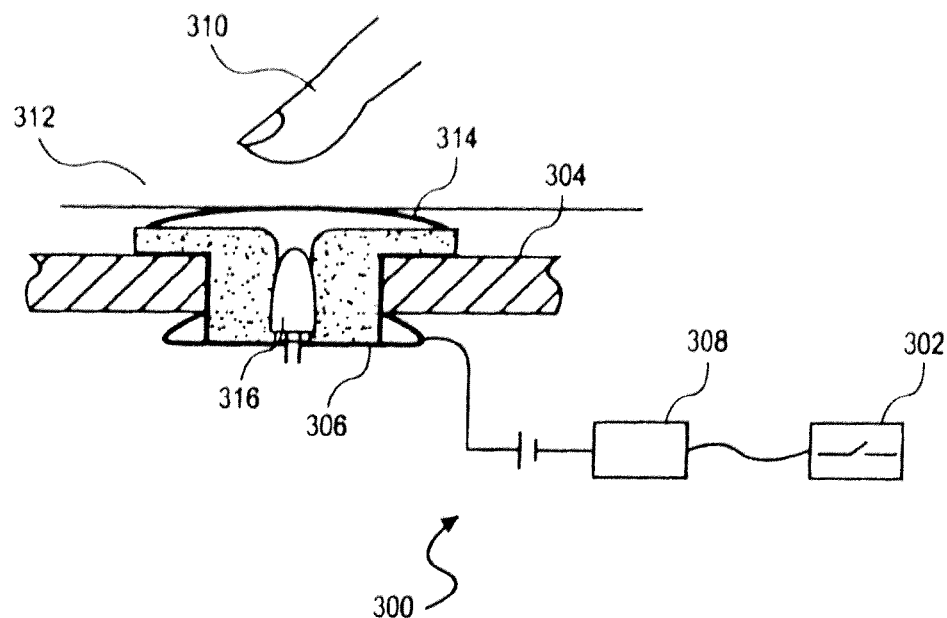
Figure 4A:
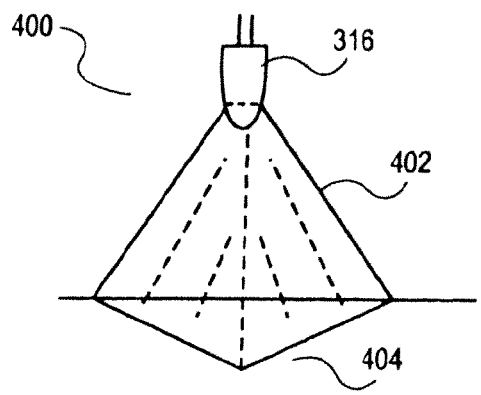
Figure 4B:
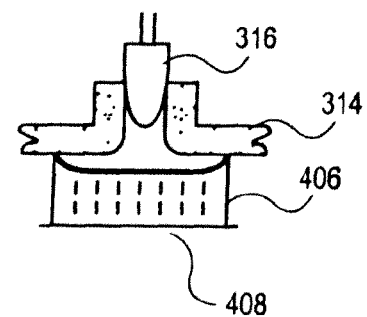
Figure 5:
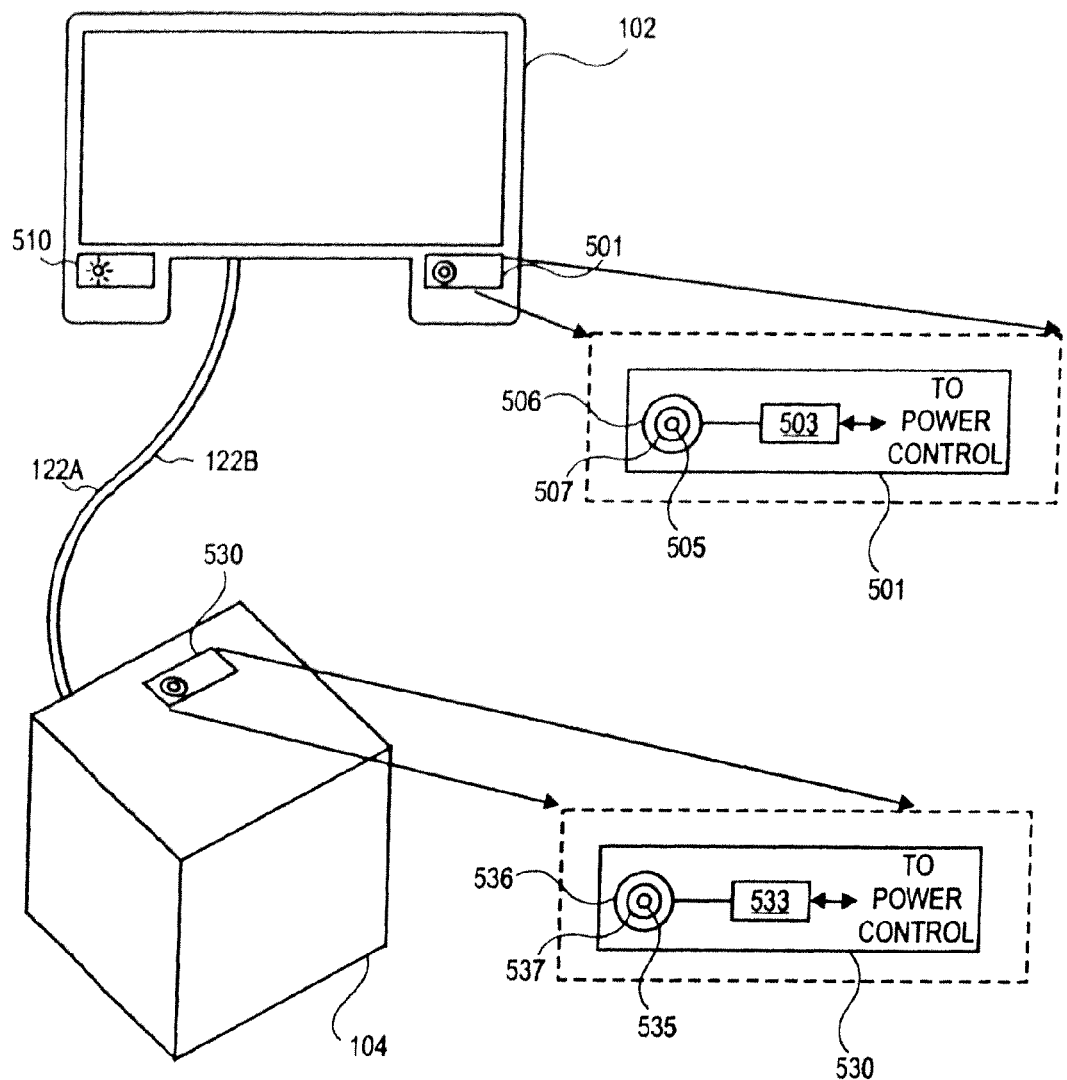
Figures 1, 5:
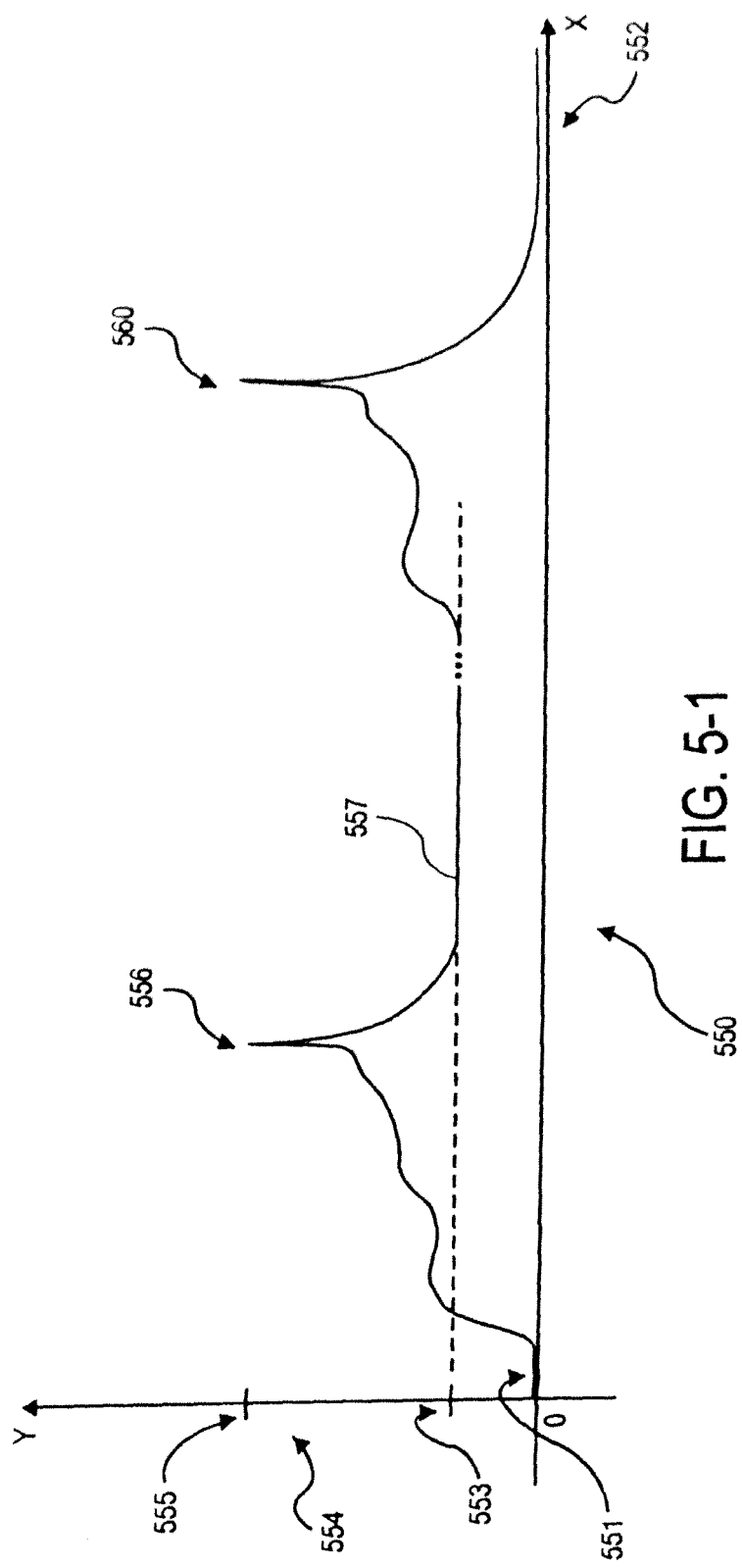
Figures 2, 5:
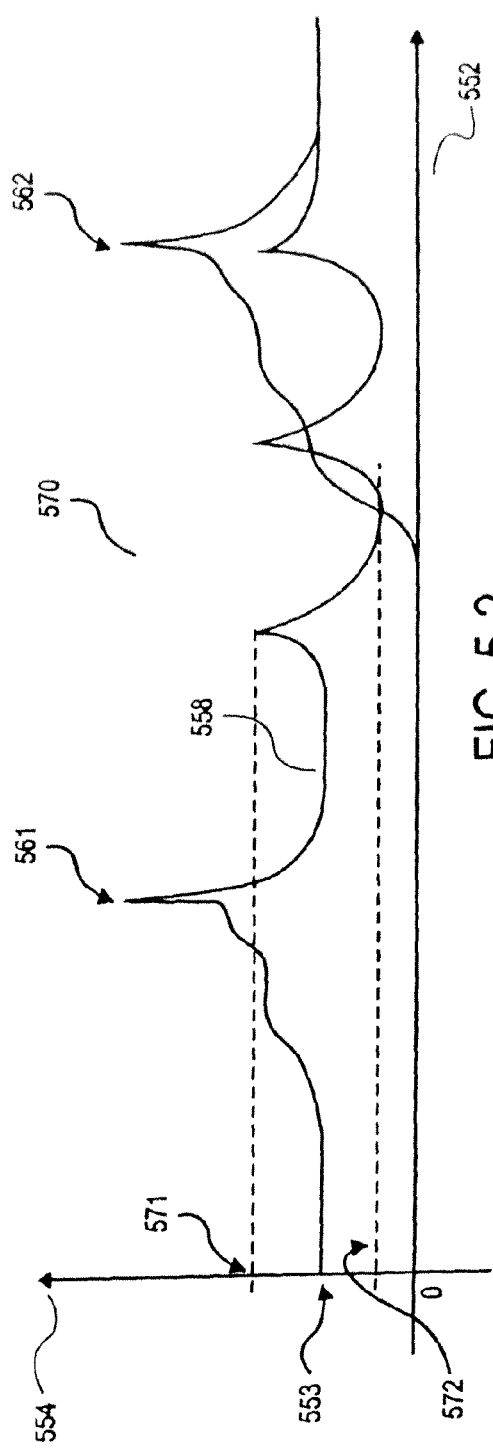
Figures 3, 5:
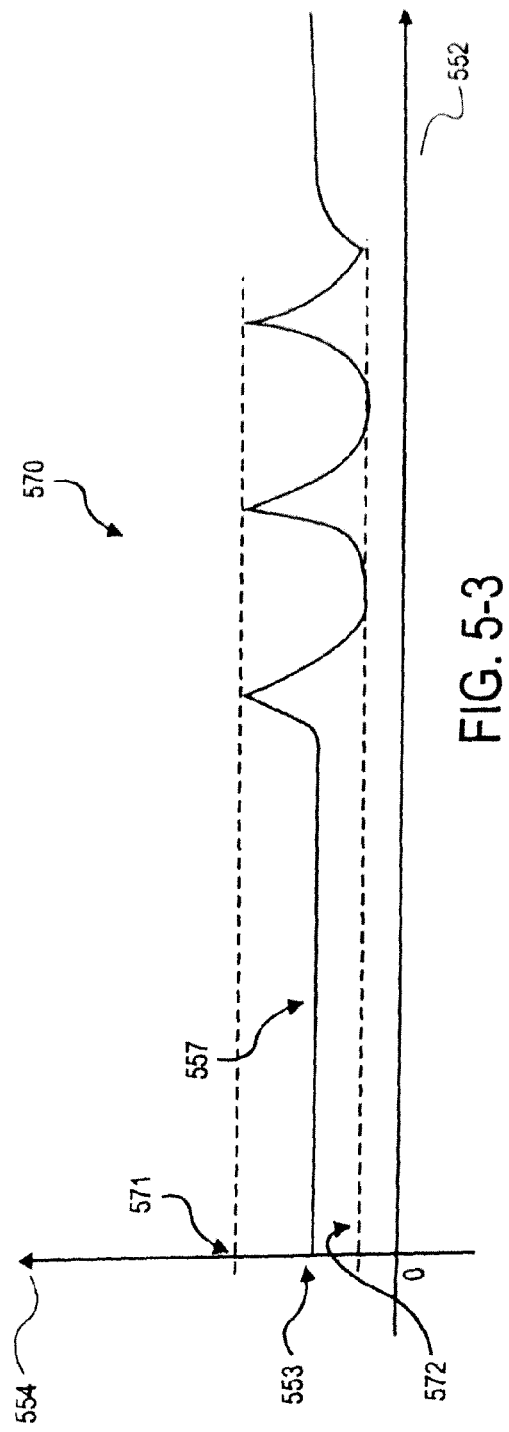

Each of the proximity-touch sensor control assembly 300 discussed above may be incorporated into the power controls of the display 102 and the desktop 104. FIG. 5 illustrates a power control 501 which has a first proximity-touch sensor control assembly like the assembly 300 mounted behind an outer surface of the display 102 and a second proximity-touch sensor control assembly mounted behind an outer surface of the desktop 104 (e.g., the top surface of a desktop computer system which resembles a cube). In this example, the outer surfaces of the desktop 104 and the display 102 are smooth surfaces. A mark as shown in FIG. 5 may be printed on each of the surfaces such that the user knows the area of the proximity-touch sensing. Because there is no protruding button on the surface of these appliances, the user will also experience a unique feeling of smoothness or cohesiveness when the user glides his finger on these surfaces toward power controls.

Just as described in FIG. 3, FIG. 5 shows that a proximity-touch sensor control assembly 501 forms the power control for the display 102. The assembly 501 is coupled through a circuit 503 to a power control unit, which includes the display 102 and the desktop 104. The assembly 501 further includes a sensor 506, a sensing circuit 503, an indicator 505, and a light pipe 507.

Similarly, just as described in FIG. 3, FIG. 5 also shows that a proximity-touch sensor control assembly 530 forms the power control for the desktop 104. The assembly 530 is coupled through a circuit 533 to a power control unit, which includes an electrical switch to trigger or activate both the display 102 and the desktop 104 of the computer system. The assembly 530 further includes a sensor 536, a sensing circuit 533, an indicator 535 and a light pipe 537.

In one exemplary embodiment, the display 102 interfaces with the desktop 104 in order for a user to trigger both the display and the desktop only by touching either only control assembly 501 or only control assembly 530. This interface may occur through the cable 122B which carries electrical signals between the control assembly 501 and the control assembly 530 and to a power control or management unit within the desktop system 104. In this embodiment, the display 102 is configured to draw its power from the desktop 104 through the power cable 122A which is coupled to the desktop 104.

Another unique feature of the present invention is that the computer system's power controls exhibit "proximity" behaviors. When a user-touch, such as a finger's touch, is within the sensing range, for example, two-inches, of the proximity-touch sensor control assembly 300, the intensity of the indicator 316 increases. However, depending on the sensitivity selection of the sensor for the control assembly 300 and the user's preference, the sensing range may be smaller or larger than two-inches.

FIG. 5-1 graphically illustrates "proximity" and "triggering" behaviors 550 for the embodiment discussed above. In FIG. 5-1, the x-axis 552 indicates a timeline, the y-axis 554 indicates the intensity for the LED indicator 316. When the computer system is in the shutdown mode, the LED's intensity is at the "zero" level as shown by the line 551. As the user gets closer to the center of and within the sensing range of proximity-touch sensor control assembly 300, the LED's intensity gets brighter and brighter as the user gets closer. The intensity flashes to the highest level 555 when a touch event 556 occurs and remains at that level for the duration of the touch. When the user moves away from the control assembly 300, the LED fades down to a low glow level 553 which indicates that the computer system is in run mode 557.

The computer system 500 may be configured so that only the control assembly being approached and touched exhibit the proximity and triggering behaviors (e.g., the assembly 501 on the display exhibits these behaviors and the assembly 530 does not). Each of the control assembly 300 may be configured so that once the control assembly is triggered by the user-touch 556, it cannot be triggered again until the user has moved away from the control assembly's sensing area for a predetermined distance, for example, 0.5 inches. Then, the control assembly 300 may be triggered again as described above.

The control assembly 300 may also be configured so that the computer system will go from a run mode into shutdown mode or sleep mode if the control assembly 300 is once again triggered the second time. From the run mode (as shown by the line 557), a touch event 560 may put the system into shutdown mode at level 551. Here, the LED indicator will get brighter and brighter as the user approaches the sensing area. The intensity will reach the maximum levels 555 and fade down to level 551 to show shutdown mode.

Another unique feature of the present invention is that the indicator 316 may be designed to exhibit "breathing" behavior to show that the computer system is in a sleep mode. A design that synchronizes the breathing behaviors of each of the indicator 316 that is mounted in each of the monitor 102, and the desktop 104 enhances the unified system experience. Such a breathing behavior may be rythymatic and repetitive patterns of sounds, movements, light or the like.

The breathing behavior may be indicated by rythymatic and repetitive patterns of light intensity. FIGS. 5-2 and 5-3 graphically demonstrate the breathing behaviors 570 of the indicator 316. The computer system may go from run mode 553 to sleep mode 572 when the user activates either the control assembly 300 on the monitor 102 or the control assembly 300 on the desktop 104. As illustrated in the figures above, the touch event 561 would lead the computer system to go into a transitional state 558 and then into a sleep mode. The intensity for the LED fluctuates from a maximum sleep intensity 571 to a minimum sleep intensity 572 in rythymatic and repetitive manner.

In another example, the computer system may be set up with an energy-saving option. Using this option, the computer system may be set to automatically go from run mode into sleep mode after a predetermined amount of time, for example, five minutes, that the system is in idle state. FIG. 5-3 graphically illustrates that the intensity of each LED indicator 316 goes directly from run mode at intensity level 553 into sleep mode with the intensity fluctuating from level 571 to level 572. Here, the proximity or touch event never occurs thus the intensity never approaches level 555 before it drops to level 571 for sleep mode. The intensity of the LEDs on the display and the desktop system may, in one embodiment, exhibit this same intensity fluctuating behavior.

The computer system may also be triggered into sleep mode manually at the monitor 102 or by some other screen interaction. The breathing behavior here will be the same as shown in FIG. 5-2.

The proximity, triggering, and breathing behaviors of the proximity-touch sensor may be enabled or disabled as per users' preferences. The enabling or disabling option may be activated with a preference menu discussed above in relation to FIG. 2-4.

As apparent from the discussion of the exemplary embodiments above, one unique and novel feature of this present invention is the use of a capacitive sensing field to sense the relative proximity of a user or an object to a control assembly and have an indicator associated with this proximity which provides feedback that represents this proximity. The light feed back examples discussed above gives the user a unique feeling of recognition of a state of the computer system as well as the distance to the controls of the computer system. This feature creates a more active interaction of all the devices of the computer system. The capacitive sensing field thus may be implemented into several embodiments of the present invention together with LED indicators to exhibit proximity, triggering and breathing behaviors of the power controls of the computer system.

The proximity-touch sensor control assembly 300 described above may also be incorporated into a display menu control 210 (FIG. 2) and/or a display menu control 510 (FIG. 5) located on the monitor display 102. This incorporation may replace the conventional right mouse click function or other screen interactions typically used to pull up a preference menu for the display. The assembly 300 may be mounted behind an outer surface of display 102. The assembly 300 functions as a control that triggers the appearance of a preference setting for the display 102 or other preference settings. In this embodiment, as the user gets closer to the control 510, the LED inside the assembly may get brighter to indicate to the user that he is approaching a control of the display. Once the user touches the control, the control 510 triggers the preference menu to pop up on the display. The user may the select a preferred option for the display using a key on the keyboard or the click on the mouse device. The computer system may be configured such that the preference menu disappears when the user once again triggers the central assembly 300. Alternatively, the preference menu may be set up to automatically disappear after the user selects an option.

FIGS. 6-1, 6-2, and 6-3 illustrate an exemplary embodiment of methods that create a unified computer system experience via interfacing the hardware controls and their behaviors to each other. In this embodiment, a power control will have the same interaction and behavior to the overall computer system whether it is located on the desktop 104 or the monitor 102. The power control of the monitor is configured to interface with the power control of the desktop using the embodiments described herein.

Figures 1, 6:
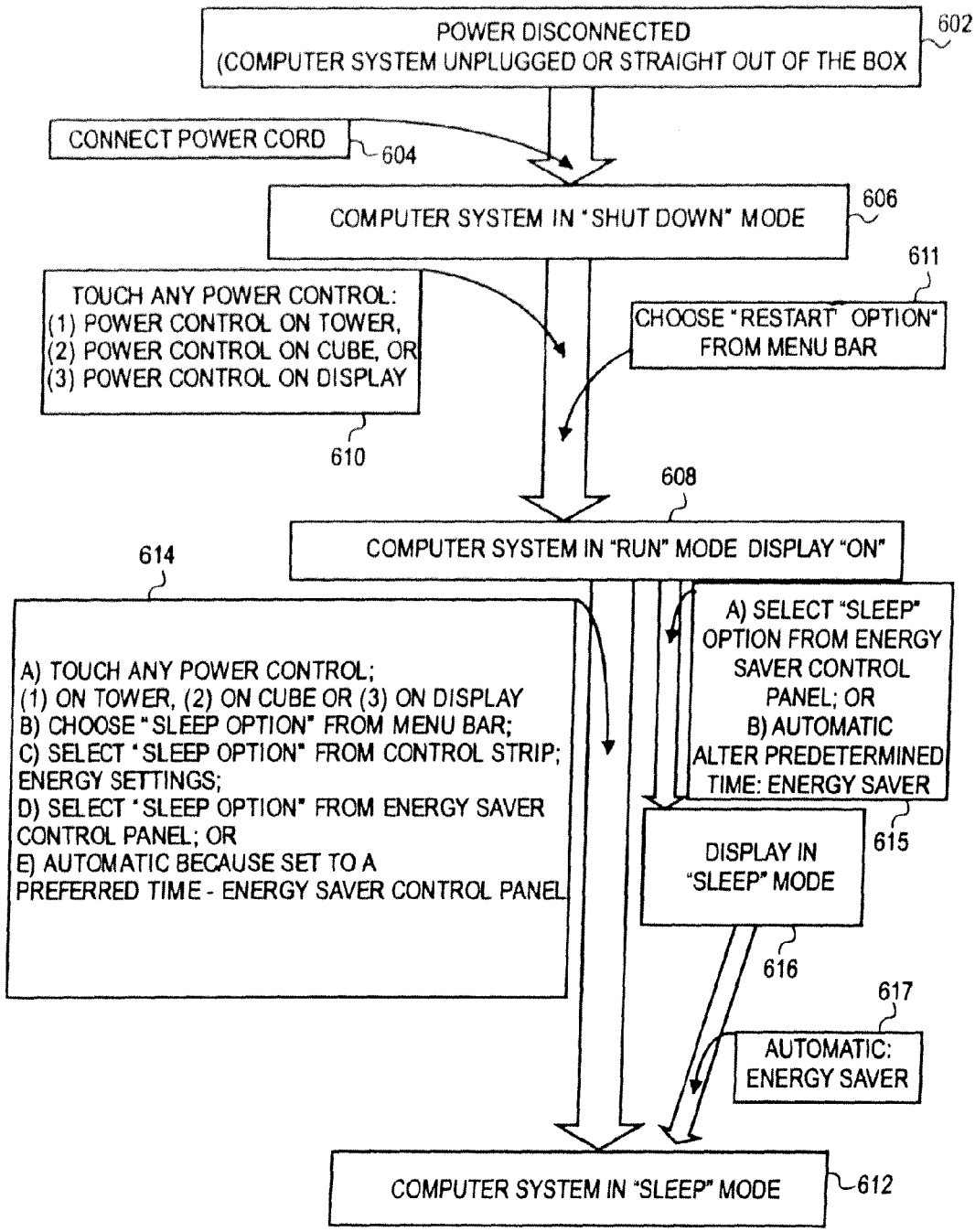
Figures 2, 6:
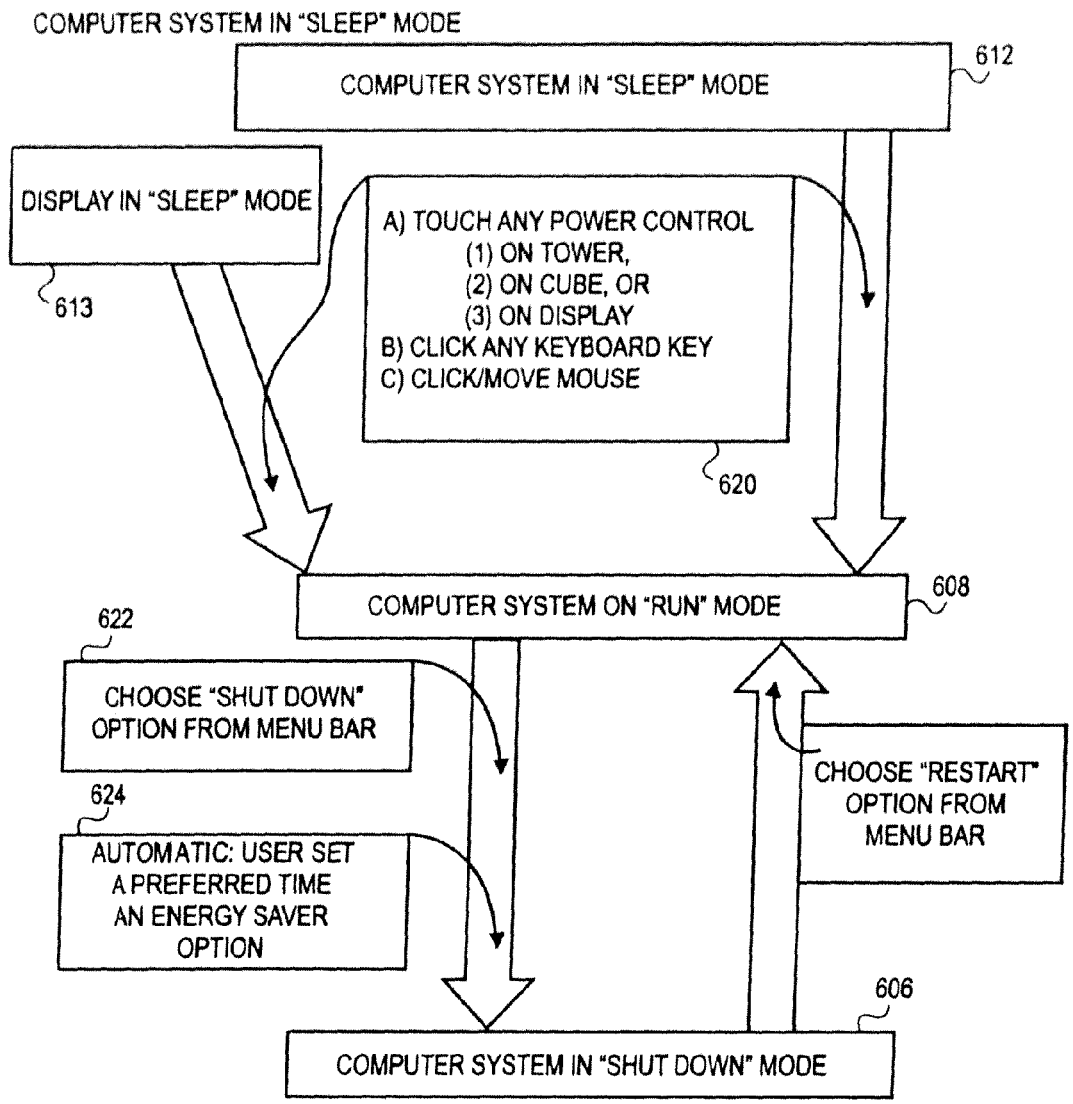
Figures 3, 6:
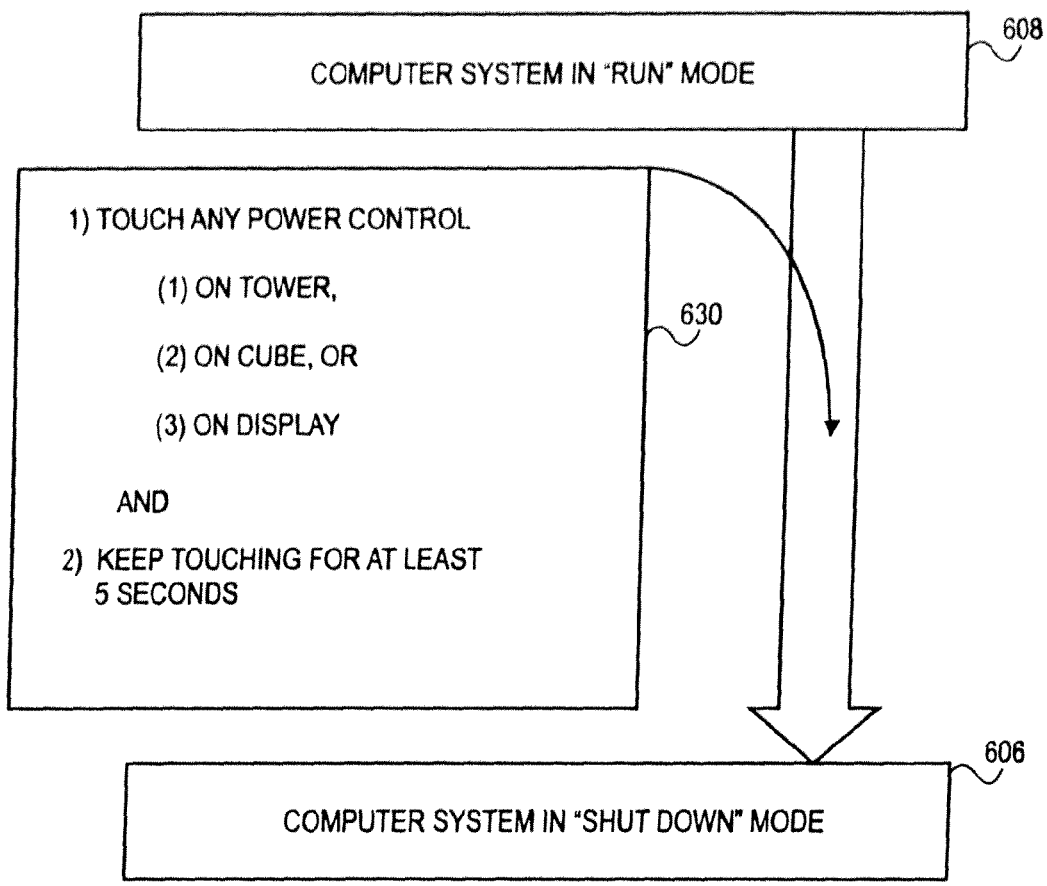

Step 602 of FIG. 6-1 illustrates when the computer system is unplugged the power is disconnected. The user may then connect the power cord in the desktop at step 604, which puts the computer system to a shutdown mode 606. From the shutdown mode 606, the computer system may be put into a run mode 608 with step 610 in which the user touches any of the power controls either on the desktop (CPU, which may be for example, a tower or a cube, or a formfactor) or on the display. Alternatively, at step 611, the user may put the computer system into run mode 608 by choosing a restart option from the menu bar when the system is already in run mode.

Once in the run mode 608, the computer system may be put into a sleep mode 612 by any of the methods in step 614. In step 614 the user may put the computer system into the sleep mode 612 by (1) touching any of the power controls either on the desktop or the display; (2) selecting the "sleep" option from a menu bar on the display; (3) selecting the "sleep option" from the control strip (an energy setting); (4) selecting the "sleep" option from Energy Saver Control Panel; or (5) setting a preferred amount of time for automatic shutdown after a predetermined idle period. Alternatively, at step 615, the user may put the display into a sleep mode 616 from the display's "on" mode (when the computer system is in the run mode 608) with step 615. In step 615, the display can be put into a sleep mode by the user selecting sleep option. In step 615, the display can also be put into a sleep mode automatically at a predetermined time. Furthermore, the display is in the sleep mode 616 for a predetermined amount of time and the computer system has already been set at an automatic energy saving option, the computer system can be put into the sleep mode 612 automatically (step 617).

Step 620 of FIG. 6-2 illustrates that from the sleep mode 612 or the sleep mode 613, the user, by touching any power control either on the display or on the desktop, may put the computer system back into the run mode 608. Alternatively, the user may click any of the keyboard keys or the mouse to put the computer system into the run mode.

To shutdown the computer system from the run mode 608, the user may select the "shutdown" option 622 from a display menu bar. In another example, the user may also set a preferred amount of time for automatic shutdown of the computer after a predetermined idle period in step 624. In yet another example, as shown in step 630 of FIG. 6-3, the user may touch any of the power control either on the display or on the desktop and maintain the touch for at least a predetermined period of time (e.g., more than five seconds) to shutdown the system. The computer system may be configured to allow a shorter or longer amount of time that the user needs to hold the touch shutdown the system.

Figure 7:
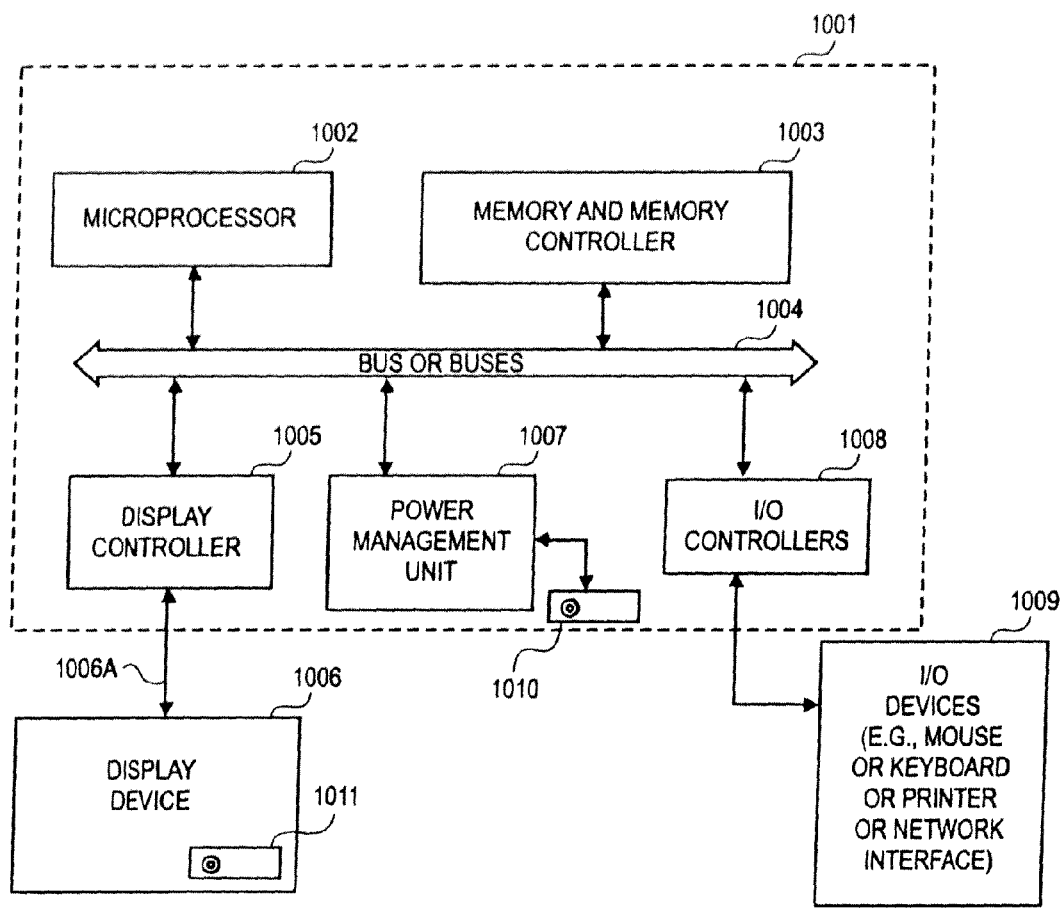
FIG. 7 illustrates an exemplary embodiment of a computer system which includes a display device.

As noted above, the foregoing systems and methods to provide control assemblies and indicators may be used with computer systems. FIG. 7 shows one example of a typical computer system which may be used with the present invention. Note that while FIG. 7 illustrates various components of a computer system, it is not intended to represent any particular architecture or manner of interconnecting the components, as such details are not germane to the present invention. For example, the computer system may include multiple buses interconnected by bus bridges. Further, it will be appreciated that network computers and other data processing systems such as personal digital assistants may have fewer components or perhaps more components and that such systems and computers may be also used with the present invention. The computer system of FIG. 7 may, for example, be an Apple Macintosh computer. As shown in FIG. 7, the computer system 1001, which is a form of a data processing system, includes a bus 1004 which is coupled to the microprocessor 1002 and to the memory and memory controller 1003. The bus 1004 is also coupled to I/O (input/output) controllers 1008 which are in turn coupled to I/O devices 1009. The bus 1004 is also coupled to a display controller 1005 which is in turn coupled to a display device 1006 through a connection such as a cable 1006a. A power management unit 1007 is also coupled to the bus 1004. It will be appreciated that the bus 1004 interconnects the various components together to allow data and control signals to be exchanged between the various components of the system. As noted above, the bus 1004 may include one or more buses connected to each other through various bridges, controllers and/or adapters as is well known in the art. In one embodiment, the I/O controller 1008 includes a USB (universal serial bus) adapter for controlling USB peripherals. The microprocessor 1002 may be a G3 or G4 microprocessor from Motorola or IBM or may be an Intel Pentium microprocessor. The memory 1003 is typically dynamic random access memory (DRAM). It will be further appreciated that typically, a storage device, such as a magnetic hard drive and other storage devices such as CD ROM drives may also be coupled to the bus 1004 through a controller.

The power management unit 1007 controls power supplied to the various components of the system in the various types of power states. For example, in certain lower power states, the hard drive and other components may receive no power while the memory and microprocessor receive power. In other lower power states, all components except for the memory and memory controller 1003 may receive power. These various different power levels are controlled by the power management unit 1007 which may be implemented in a combination of software and hardware, where the software is executed in part by the microprocessor 1002 and in part by a processor within the power management unit such as a state machine executing in a logic device within the power management unit 1007.

It will be apparent from this description that aspects of the present invention may be embodied, at least in part, in software. That is, the techniques carry out in a computer system or other data processing system in response to its processor, such as a microprocessor, executing sequences of instructions contained in a memory, such as memory 1003. In various embodiments, hardwired circuitry may be used in combination with software instructions to implement the present invention. Thus, the techniques are not limited to any specific combination of hardware circuitry and software, nor to any particular source for the instructions executed by the data processing system.

The computer system 1001 includes a control assembly 1010 which includes a switch or sensor and an indicator, and thus this control assembly 1010 is similar to the control assembly 230 of FIG. 2A or control assembly 530 of FIG. 5. The control assembly 1010 is coupled to circuitry for controlling the indicator and for receiving signals from the sensor or switch. It will be appreciated that the positioning of the components of the control assembly 1010 may be altered such that the indicator is located at a different position than the sensor or switch (e.g. they are not concentric or overlying, but rather separated by a distance). The control assembly 1011 is disposed in the display device 1006 and corresponds to similar control assemblies 201 of FIGS. 2A and 501 of FIG. 5. The control assembly 1010 typically includes a sensor or switch and an indicator which is coupled to circuitry to sense the switch or sensor in the circuitry to control the presentation (e.g. the display of light or the emission of sound) from the indicator. Again, the sensor or switch and the indicator of the control assembly 1010 may be concentric or overlaying or may be separated by a distance so that they appear to the user as two distinct objects. In one preferred embodiment, however, the indicator and the sensor, which is a capacitive touch sensor, are substantially concentric and appear to the user as one object. In one embodiment, the cable 1006a may include both power cables such as cable 122a and a data and control cable such as cable 122b as in the case of FIG. 5.

Figure 8:
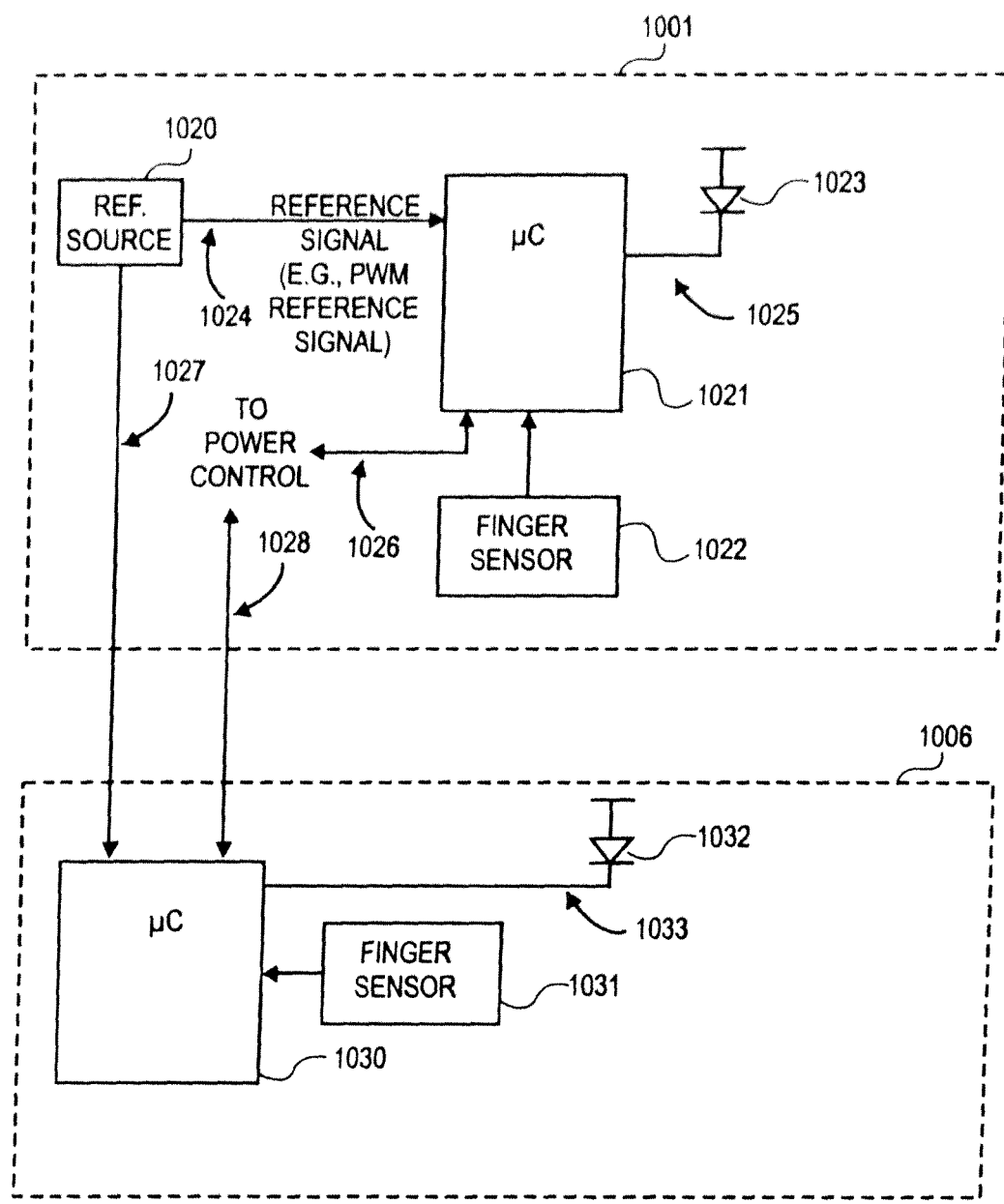
FIG. 8 illustrates an exemplary embodiment of two interconnected control assemblies which may be used with the embodiment of FIG. 7.

FIG. 8 shows in further detail a particular embodiment which implements the control assemblies 1010 and 1011 of FIG. 7. To simplify FIG. 8, certain components of the computer system 1001 have not been shown in FIG. 8. It will be appreciated, however, that these components are present in the embodiment of FIG. 8. FIG. 8 shows an implementation of a control assembly in each of the computer system 1001 and the display 1006. In one embodiment, the control assembly 1010 may include a microcontroller or other processor 1021 which is coupled to an indicator, such as an LED, through a control signal 1025. The control assembly 1010 further includes a finger sensor 1022 which is coupled to provide a signal, such as a sensor signal, to the microcontroller 1021. The microcontroller 1021 provides a power control signal 1026 to a power management unit, such as the power management unit 1007. The microcontroller 1021 receives a reference signal, such as a pulse width modulated (PWM) reference signal from a reference source 1020. The reference source 1020 may be the power management unit 1007 or the microprocessor 1002 or some other logic in the system 1001 which generates the reference signal, such as a PWM signal. This reference signal is also provided over signal line 1027 to the microcontroller 1030 which is part of the control assembly 1011 of the display device 1006. The control assembly for the display 1006 as shown in FIG. 8 further includes a finger sensor 1031 and an indicator, such as an LED 1032, which is coupled to the microcontroller 1030 through the control signal line 1033. It will be appreciated that the relative positioning of the various components may be altered such that the microcontrollers 1021 and 1030 may not be positioned relatively closely to the LEDs 1023 and 1032 or to the finger sensors 1022 and 1031. Thus, for example, the microcontroller 1030 may in fact be housed within the housing of the computer system 1001. It will be appreciated that the finger sensor shown in FIG. 8 may be a capacitive sensor such as that described in the copending patent application referred to above or it may be a simple mechanical switch. It will be appreciated that in typical embodiments as described above, the finger sensor or switch, such as sensors 1022 and 1031, are used by the user to turn the computer system off or to turn the computer system on to or put the computer system into a sleep state in which power consumption is reduced. Further, the LED indicators 1023 and 1032 are similar to the indicators of control assemblies 201 and 230 shown in FIG. 2A or the indicators 505 and 535 of FIG. 5, and hence, the indicators 1023 and 1032, in one embodiment, may indicate the power consumption state of the computer system and may do so in a synchronized manner. The method in which the indicators are synchronized will now be described by referring to FIGS. 9, 10, 11, and 12.

Figure 9:
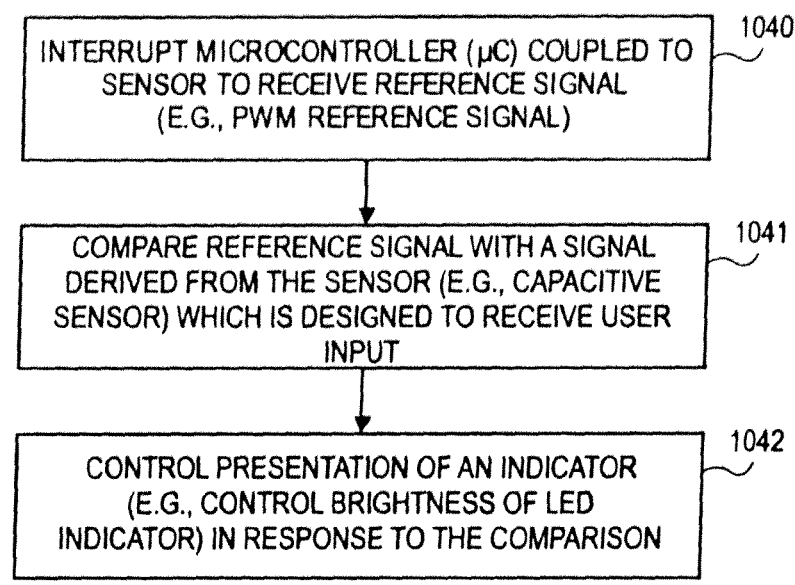
FIG. 9 is a flowchart which illustrates an exemplary method of the present invention.

FIG. 9 shows a method of operating the system shown in FIG. 8. This method begins in operation 1040 in which both microcontrollers are interrupted by an interrupt signal which is periodically provided to both microcontrollers. This interrupt, as is further shown in FIG. 11, causes the microcontrollers to receive and regenerate the PWM reference signal and then to compare, in one embodiment, the reference signal in operation 1041. Operation 1041 compares the reference signal with a signal derived from the sensor, which may be a capacitive sensor which is designed to receive user input. In this one embodiment, this comparison determines whether the PWM reference signal has larger pulses than a PWM signal obtained by filtering the sensor signal and converting the filtered sensor signal to a PWM signal. If the reference PWM signal has larger pulses than the PWM signal obtained from the filtered sensor signal, then the microcontroller will pass the reference PWM signal to the LED through the control lines 1025 and 1033 for the respective LEDs 1023 and 1032. In this manner, the reference PWM signal controls the presentation of the indicator in response to the comparison, as shown in operation 1042. If the pulses in the PWM signal derived from the filtered sensor signal are larger than the pulses from the reference PWM signal, then the microcontroller mixes the reference signal with the PWM signal derived from the sensor signal and uses this mixed or modulated signal to drive the LED which is coupled to the associated microcontroller. FIG. 12 shows an example of the mixing which may be performed by an algorithm executed on both microcontrollers. The mixing or modulation function may be addition or the greatest of the incoming signals or some other function, depending on the embodiment. The processing of the signals digitally gives flexibility over the mixing function for different desired visual effects or auditory effects depending on the manner of presentation. Thus the incoming PWM signals 1080, 1081 or 1082 may be mixed as shown in FIG. 12 by various different functions 1083 to produce an output 1084.

In an alternative embodiment of operation 1041, an output value from the sensor (e.g., a filtered frequency) is used to determine whether a touch event has occurred and the microcontrollers then accordingly control the presentation of one or more indicators (e.g., the LEDs display a short flash and fade). The microcontrollers may in this case control the LEDs by mixing the reference PWM signal with a PWM signal derived from a stored look up table in order to generate a mixed PWM signal to drive the LEDs, or a different reference PWM signal may be supplied by the reference source 1020 and used to drive one or more LEDs or other indicators. In this case, the presentation in operation 1042 is in response to the detection of a finger touch on the sensor or some other detected event (another user command such as the selection of "sleep" from a user menu) rather than a comparison.

Figure 10:
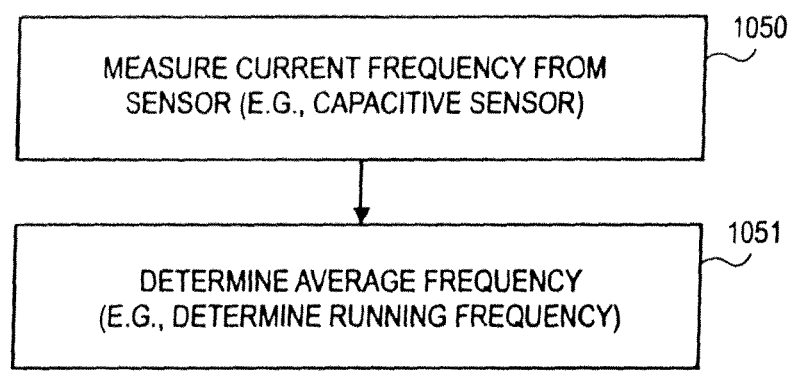
FIG. 10 is a flowchart which illustrates an exemplary method of the present invention.

FIG. 10 shows a method for filtering a signal from a sensor, such as a capacitive finger sensor. In operation 1050, the current frequency from the sensor is measured and then an average frequency is determined in operation 1051 by determining a running frequency. In one embodiment, the prior average is modified to create a current running average of the frequency derived from the capacitive sensor. One embodiment for deriving this frequency is described in the above-mentioned copending application, which is hereby incorporated herein by reference. The operation 1051 filters the frequency and thereby filters out high frequency noise while detecting larger amplitude, low to mid-frequency changes which are indicative of a user activating the touch sensor. The filtered value, which is the average frequency, may be used to determine that a touch event (e.g., a finger has touched the sensor) has occurred. It will be appreciated that the frequency from operation 1050 may be provided by finger sensors 1022 and 1031 to the microcontrollers 1021 and 1030 respectively, which can then determine the average frequency.

In the embodiment which uses operation 1041 of FIG. 9, a value from the sensor (e.g., a frequency) is converted to a pulse width modulated signal for comparison to the reference pulse width modulated signal. In turn, this comparison causes the respective microcontroller to drive its associated LED with the same pulse width modulated signal which was determined by the comparison. It is noted that when a user has not touched either finger sensor, the pulse width signal which is output on signal lines 1052 and 1053 will be the same, causing the LEDs to present the same level of brightness. Furthermore, since both microcontrollers received the same PWM reference signal, both LEDs can be made to synchronously display complex, repetitive patterns (e.g., see FIGS. 2-3) when no user touch occurs. The appearance of both LEDs may be changed by merely changing the PWM reference signal from reference source 1020. However, when a user touches one of the two sensors, its corresponding LED will appear differently than the other LED due to the mixing of the signal derived from the finger sensor which has been touched.

Figure 11:
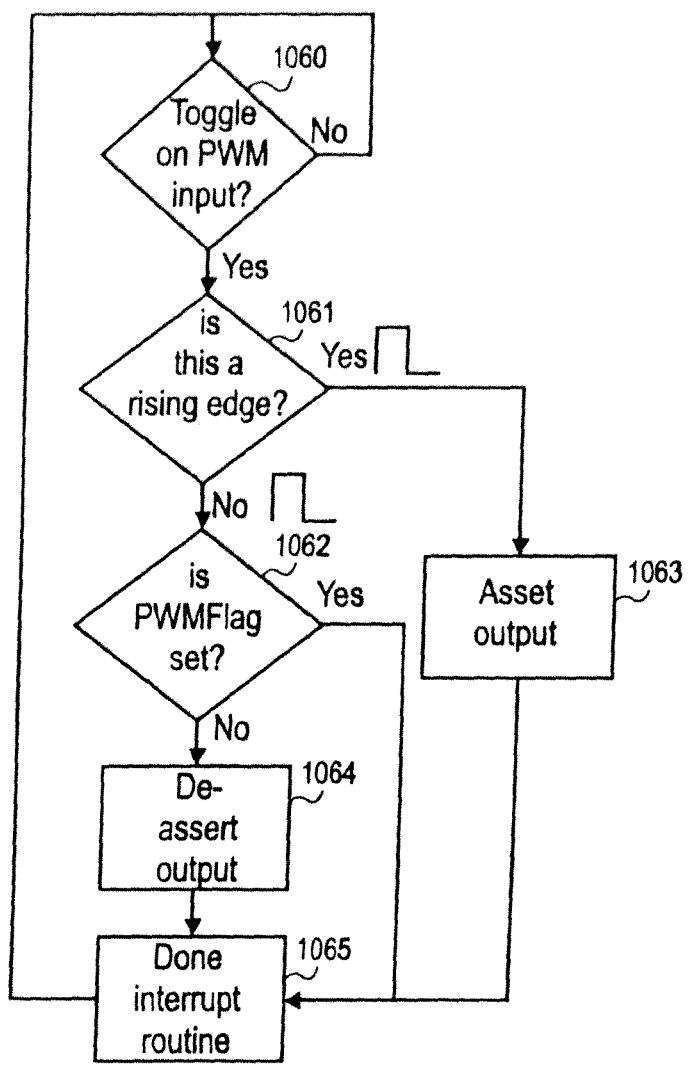
FIG. 11 is another flowchart which illustrates an exemplary method of the present invention.
Figure 12:
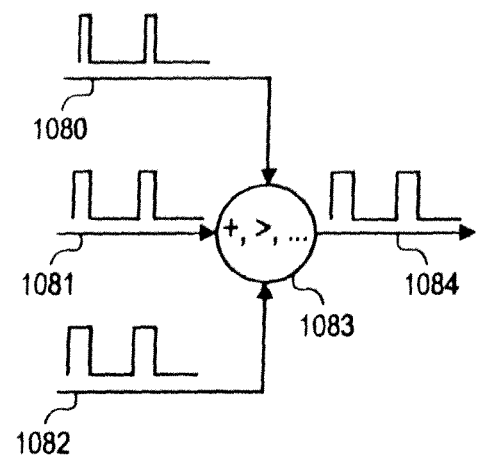
FIG. 12 shows a modulator which may be used in certain embodiments of the invention.

FIG. 11 shows a method which is performed by each microcontroller in order to repeat with high accuracy and low jitter the digital pulse width modulated reference signal each microcontroller receives through signal lines 1024 and 1027. The method shown in FIG. 11 also allows each microcontroller to modify the duty cycle when required while maintaining synchronicity with the original signal. It is noted that the reference source 1020 may, in one embodiment, generate a first PWM reference signal when the system is running (e.g. a signal which is sufficient to generate the appearance of the low glow level 553 when the system is running) and a different PWM reference signal to give the breathing appearance between the levels 571 and 572 as shown in FIG. 5-3. As noted above, the power management unit may generate these different PWM reference signals and supply the signals to the different control assemblies, either directly or through the buses or bus of the computer system.

When any signal is sampled and reproduced, it is subject to error introduced by the sampling process. Each microcontroller 1021 and 1030 is sampling and attempting to reproduce the PWM reference signal. One of the common problems associated with sampling is jitter due to too low a sampling frequency created by processor speed limitations. When the reproduce signal is used to drive a LED, such as indicators 1023 and 1032, the jitter will result in a poor visual appearance. To avoid this problem, each microcontroller utilizes a high priority, double edged hardware interrupt with the method of FIG. 11. This double edged hardware interrupt reduces latency of the repeated signal to within a few microseconds. It is the regenerated PWM reference signal which is then used in the comparison of operation 1041. This regenerative reference signal is then used to directly control the LED or is mixed with other PWM signals to drive the LEDs of the corresponding microcontrollers. The method of FIG. 11 is double edged in the sense that the microcontroller's normal code execution is interrupted and this routine is executed when either a rising or falling edge is detected on the incoming reference PWM signal on lines 1024 or 1027. Once the toggle on the incoming PWM signal is detected in operation 1060, the interrupt routine is entered. First the routine determines in operation 1061 the direction of the signal change. On a rising edge, the routine immediately asserts the output in operation 1063. This ensures that the incoming reference signal (from either lines 1024 or 1027) and the regenerated PWM signals are synchronized within only a few microseconds of latency. On a falling edge, the routine quickly checks the status of a flag called PWM flag in operation 1062. This flag is set if other PWM sources require that the duty cycle be greater than that of the incoming signal. If this flag is not set, the routine immediately deasserts the output pin in operation 1064 and otherwise the routine leaves the output unchanged and exits at operation 1065. In this manner, each microcontroller receives the reference PWM signal from the reference source 1020 and regenerates the reference signal, which can then be compared in operation 1041.

The subject invention has been described with reference to numerous details set forth herein and the accompanying drawings which illustrated the invention. This description and drawings are illustrative of the invention and are not to be construed as limiting the invention. Numerous specific details are described to provide a thorough understanding of the present invention. It will be evident that various modifications may be made thereto without departing from the broader spirit and scope of the invention as set forth in the following claims. The specification and drawings are, accordingly, to be regarded in an illustrative sense rather than a restrictive sense.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

We claim:

1. A method of operating a data processing system comprising a first device and a second device, the first device comprising a first processor, a first sensor and a first indicator, and the second device comprising a second processor, a second sensor, and a second indicator, the method comprising:

receiving a first user input to the first sensor;
in response to receiving the first user input:
displaying light from the first indicator with a first presentation; and
transmitting, with the first processor, a control signal to the second processor of the second device to control the second indicator to display light from the second indicator with a second presentation, the second presentation synchronized to the first presentation;
receiving a second input to the second sensor;
displaying light from the second indicator with a third presentation in response to a signal indicative of the second input; and
displaying light from the first indicator with a fourth presentation in response to a signal indicative of the second input, wherein the fourth presentation is synchronized to the third presentation.

2. The method of claim 1 wherein the first sensor comprises at least one of a touch and a proximity sensor.

3. The method of claim 1 wherein the first indicator comprises a first LED and the second indicator comprises a second LED.

4. The method as in claim 1 wherein the first indicator and the second indicator display a same pattern when synchronized.

5. The method as in claim 1 wherein the first sensor includes the first indicator.

6. The method of claim 1, wherein the second sensor comprises at least one of a touch sensor and a proximity sensor.

7. The method of claim 1, wherein the first device and the second control are capable of operating independently from each other.

8. The method of claim 1, wherein the first device is physically separate from the second device.

9. The method of claim 1, wherein the first type of device is a computing device and the second type of device is a display device.

10. A data processing system comprising:
a first device comprising a first processor, a first sensor, and a first indicator, the first sensor configured to receive a first user input, the first processor configured to control a presentation of the first indicator in response to the first user input; and
a second device comprising a second processor, a second sensor, and a second indicator, wherein:
the first processor is configured to transmit a control signal to the second processor to display light from the second indicator with a second presentation, the second presentation synchronized to the first presentation,
the second sensor is configured to detect a second user input,
the second indicator is configured to display light with a third presentation in response to a signal indicative of the second input, and
the first indicator is configured to display light with a fourth presentation in response to a signal indicative of the second input, the fourth presentation synchronized to the third presentation.

11. The system of claim 10 wherein the first sensor comprises at least one of a touch sensor and a proximity sensor.

12. The system of claim 10 wherein the first indicator comprises a first LED and the second indicator comprises a second LED.

13. The system of claim 10 wherein the first indicator and the second indicator display a same pattern when synchronized.

14. The system of claim 10 wherein the first sensor includes the first indicator.

15. The system of claim 10, wherein the second sensor comprises at least one of a touch sensor and a proximity sensor.

16. The system of claim 10, wherein the first device and the second device are capable of operating independently from each other.

17. The system of claim 10, wherein the second device is physically separate from the first device.

18. A non-transitory computer-readable storage medium comprising instructions for operating a data processing system comprising a first device and a second device, the first device comprising a first processor, a first sensor and a first indicator, and the second device comprising a second processor, a second sensor, and a second indicator, the instructions for:

receiving a first user input to the first sensor;
in response to receiving the first user input:
displaying light from the first indicator with a first presentation; and
transmitting, with the first processor, a control signal to the second processor of the second device to control the second indicator to display light from the second indicator with a second presentation, the second presentation synchronized to the first presentation receiving a second input to the second sensor;
displaying light from the second indicator with a third presentation in response to a signal indicative of the second input; and
displaying light from the first indicator with a fourth presentation in response to a signal indicative of the second input, wherein the fourth presentation is synchronized to the third presentation.

19. A first device comprising:
a first sensor configured to receive a first user input;
a first indicator; and
a first processor, the first processor configured to, in response to receiving the first user input:
display light from the first indicator with a first presentation; and
transmit a control signal to a second processor of a second device to display light with a second indicator of the second device with a second presentation, the second presentation synchronized to the first presentation, wherein:
the second device receives a second input to a second sensor of the second device,
the second indicator of the second device displays light with a third presentation in response to a signal indicative of the second input, and
the first indicator displays light with a fourth presentation in response to a signal indicative of the second input, the fourth presentation synchronized to the third presentation.

* * * * *

UNITED STATES PATENT AND TRADEMARK OFFICE
CERTIFICATE OF CORRECTION

PATENT NO. : 9,935,631 B2
APPLICATION NO. : 13/095806
DATED : April 3, 2018
INVENTOR(S) : Gong et al.

Page 1 of 1

It is certified that error appears in the above-identified patent and that said Letters Patent is hereby corrected as shown below:

In the Claims

At Column 16, Claim number 7, Line number 40, please replace the word "control" with the word --device--.

Signed and Sealed this
Tenth Day of July, 2018

Andrei Iancu
*Director of the United States Patent and Trademark Office*